United States Patent
Kim et al.

(10) Patent No.: US 11,925,060 B2
(45) Date of Patent: Mar. 5, 2024

(54) DISPLAY WITH MOVABLE REFLECTIVE MEMBER

(71) Applicant: LG Display Co., Ltd., Seoul (KR)

(72) Inventors: MoonSoo Kim, Paju-si (KR); Suhyeon Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 265 days.

(21) Appl. No.: 17/134,454

(22) Filed: Dec. 27, 2020

(65) Prior Publication Data

US 2021/0202914 A1 Jul. 1, 2021

(30) Foreign Application Priority Data

Dec. 30, 2019 (KR) .......... 10-2019-0177358

(51) Int. Cl.
*H10K 50/856* (2023.01)
*H10K 59/122* (2023.01)
*H10K 59/35* (2023.01)
*H10K 59/65* (2023.01)

(52) U.S. Cl.
CPC ......... *H10K 50/856* (2023.02); *H10K 59/122* (2023.02); *H10K 59/353* (2023.02); *H10K 59/65* (2023.02)

(58) Field of Classification Search
CPC ............................. H10K 50/856; G03B 17/02
See application file for complete search history.

(56) References Cited

U.S. PATENT DOCUMENTS

| | | | | |
|---|---|---|---|---|
| 2007/0133976 | A1* | 6/2007 | Gutierrez | G02B 13/001 396/248 |
| 2008/0106629 | A1* | 5/2008 | Kurtz | H04N 7/144 348/E5.022 |
| 2012/0206669 | A1* | 8/2012 | Kim | G02F 1/133308 349/153 |
| 2019/0393280 | A1* | 12/2019 | Gao | H10K 59/60 |
| 2021/0351227 | A1* | 11/2021 | Lius | H10K 59/121 |
| 2021/0405446 | A1* | 12/2021 | Yu | G02F 1/133331 |

(Continued)

FOREIGN PATENT DOCUMENTS

| | | |
|---|---|---|
| CN | 109979979 A | 7/2019 |
| CN | 110365819 A | 10/2019 |
| CN | 110379350 A | 10/2019 |

(Continued)

OTHER PUBLICATIONS

Chinese Office Action dated Nov. 18, 2023 issued in Patent Application No. 202011527714.X (7 pages).

*Primary Examiner* — Peter Bradford
(74) *Attorney, Agent, or Firm* — POLSINELLI PC

(57) ABSTRACT

A display apparatus includes a display panel having a first area and a second area, a main body supporting the display panel, an auxiliary member arranged in the main body, and a reflective member arranged between the auxiliary member and the display panel, wherein the reflective member may movably be provided to overlap the first area or the second area. Therefore, light emitted from the display panel toward the inside of the main body may be reflected in the outside, and a luminance difference between the first area and the second area of the display panel may be prevented from occurring, whereby a user's satisfaction for an image may be enhanced.

19 Claims, 13 Drawing Sheets

(56) References Cited

U.S. PATENT DOCUMENTS

2021/0408499 A1* 12/2021 Li ..................... H04M 1/0264

FOREIGN PATENT DOCUMENTS

| CN | 113871428 A | * 12/2021 |
| KR | 10-2005-0112920 A | 12/2005 |
| KR | 10-2014-0088028 A | 7/2014 |
| KR | 10-2015-0089681 A | 8/2015 |

* cited by examiner

DISPLAY WITH MOVABLE REFLECTIVE MEMBER

CROSS REFERENCE TO RELATED APPLICATION

This application claims priority from Korean Patent Application No. 10-2019-0177358, filed on Dec. 30, 2019, which is hereby incorporated by reference in its entirety.

BACKGROUND

Field of the Disclosure

The present disclosure relates to a display apparatus outputting an image.

Description of the Background

Since the flat panel display apparatus uses a glass substrate to resist high heat generated during a manufacturing process, there is limitation in lightweight and thin profile and flexibility.

Therefore, a flexible display apparatus manufactured using a flexible material such as plastic instead of a glass substrate having no flexibility to maintain display performance even though it is bent like a paper has emerged as an advanced flat panel display apparatus.

Meanwhile, studies for embodying a front surface portion on which an image is output, as a full screen display have been actively ongoing in recent years.

The full screen display means an image apparatus in which a front surface portion is embodied as a screen without a protrusion on the front surface portion by arranging additional device such as a camera, which is arranged to be protruded on the front surface portion, inside a main body (or below a display).

Since the full screen display has no additional device protruded outside the display, a satisfaction may be given to a user in view of design. Also, since a hole for protruding the additional device does not need to be provided on the front surface portion of the display, a manufacturing process may be simplified.

However, the full screen display has a problem as follows. Since an additional device, for example, a camera is arranged inside the main body (or below the display), an overlap area of the display overlapped with the additional device may be provided transparently, whereby a luminance difference between an image emitted from the overlap area of the display and an image emitted from the other area occurs to give a user a sense of difference.

SUMMARY

The present disclosure has been made in view of the above problems, and is to provide a display apparatus that may embody a full screen display without giving a user a sense of difference.

In accordance with an aspect of the present disclosure, the above and other features can be accomplished by the provision of a display apparatus comprising a display panel having a first area and a second area, a main body supporting the display panel, an auxiliary member arranged in the main body, and a reflective member arranged between the auxiliary member and the display panel, wherein the reflective member may movably be provided to overlap the first area or the second area.

In the display apparatus according to the present disclosure, as the reflective member is movably provided between the display panel and the auxiliary member to overlap the first area or the second area of the display panel, light emitted from the display panel toward the inside of the main body may be reflected in the outside, whereby a luminance difference between the first area and the second area of the display panel may be reduced to enhance a user's satisfaction for an image.

In addition to the effects of the present disclosure as mentioned above, additional advantages and features of the present disclosure will be clearly understood by those skilled in the art from the above description of the present disclosure.

BRIEF DESCRIPTION OF THE DRAWINGS

The above features and other advantages of the present disclosure will be more clearly understood from the following detailed description taken in conjunction with the accompanying drawings, in which.

DETAILED DESCRIPTION

Figure 1:
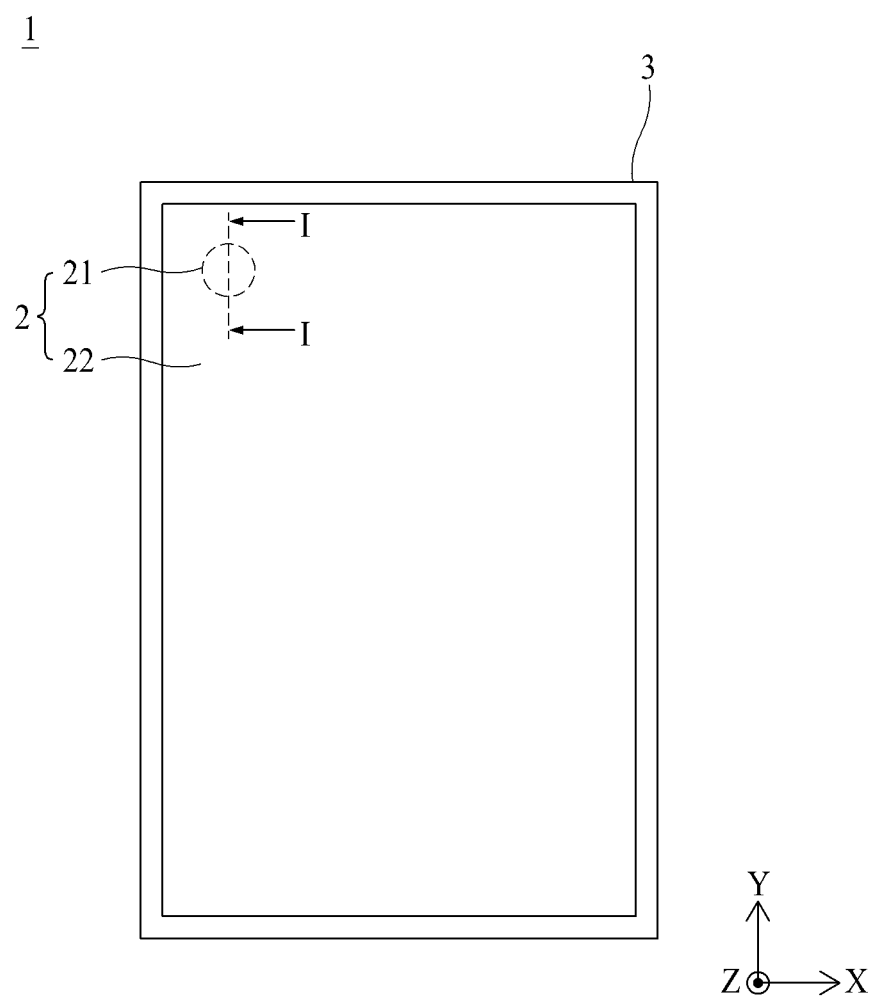
FIG. 1 is a brief plane view illustrating a display apparatus according to one aspect of the present disclosure.

Advantages and features of the present disclosure, and implementation methods thereof will be clarified through following aspects described with reference to the accompanying drawings. The present disclosure may, however, be embodied in different forms and should not be construed as limited to the aspects set forth herein. Rather, these aspects are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing aspects of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first", "second", etc. may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element, or a third element may be interposed between the corresponding elements, unless specially mentioned.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

Hereinafter, a display apparatus according to the present disclosure will be described in detail with reference to the accompanying drawings. Wherever possible, the same reference numbers will be used throughout the drawings to refer to the same or like parts.

Figure 2A:
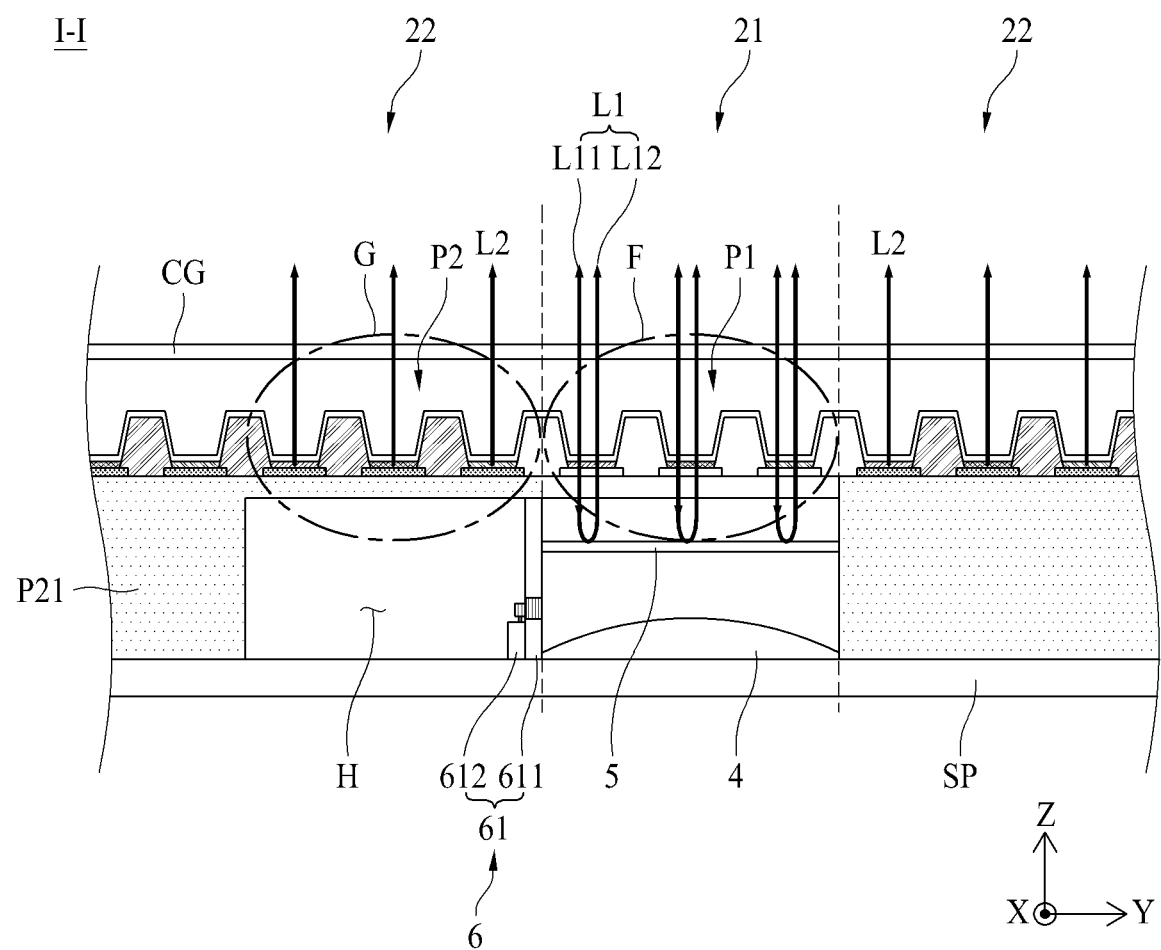
FIG. 2A is a brief cross-sectional view taken along line I-I shown in FIG. 1.
Figure 2B:
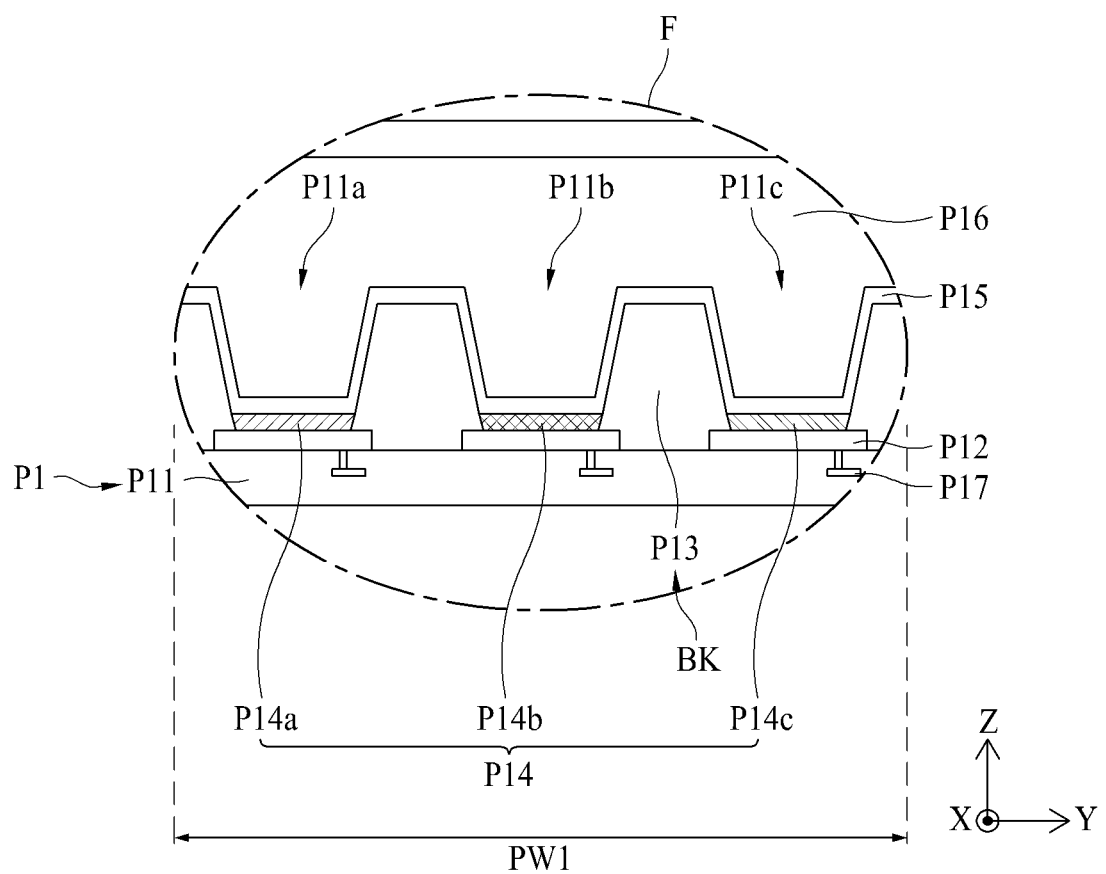
FIG. 2B is a brief enlarged view illustrating a portion F of FIG. 2A.
Figure 2C:
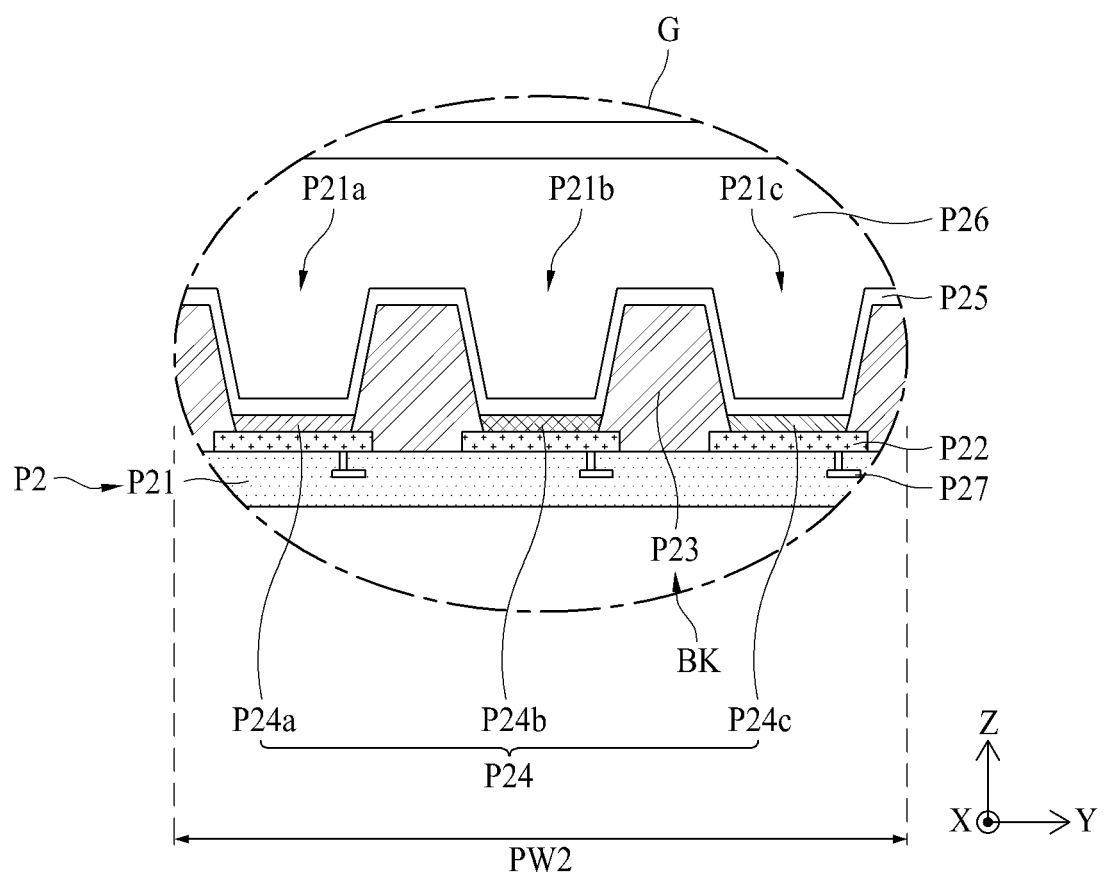
FIG. 2C is a brief enlarged view illustrating a portion G of FIG. 2A.
Figure 3:
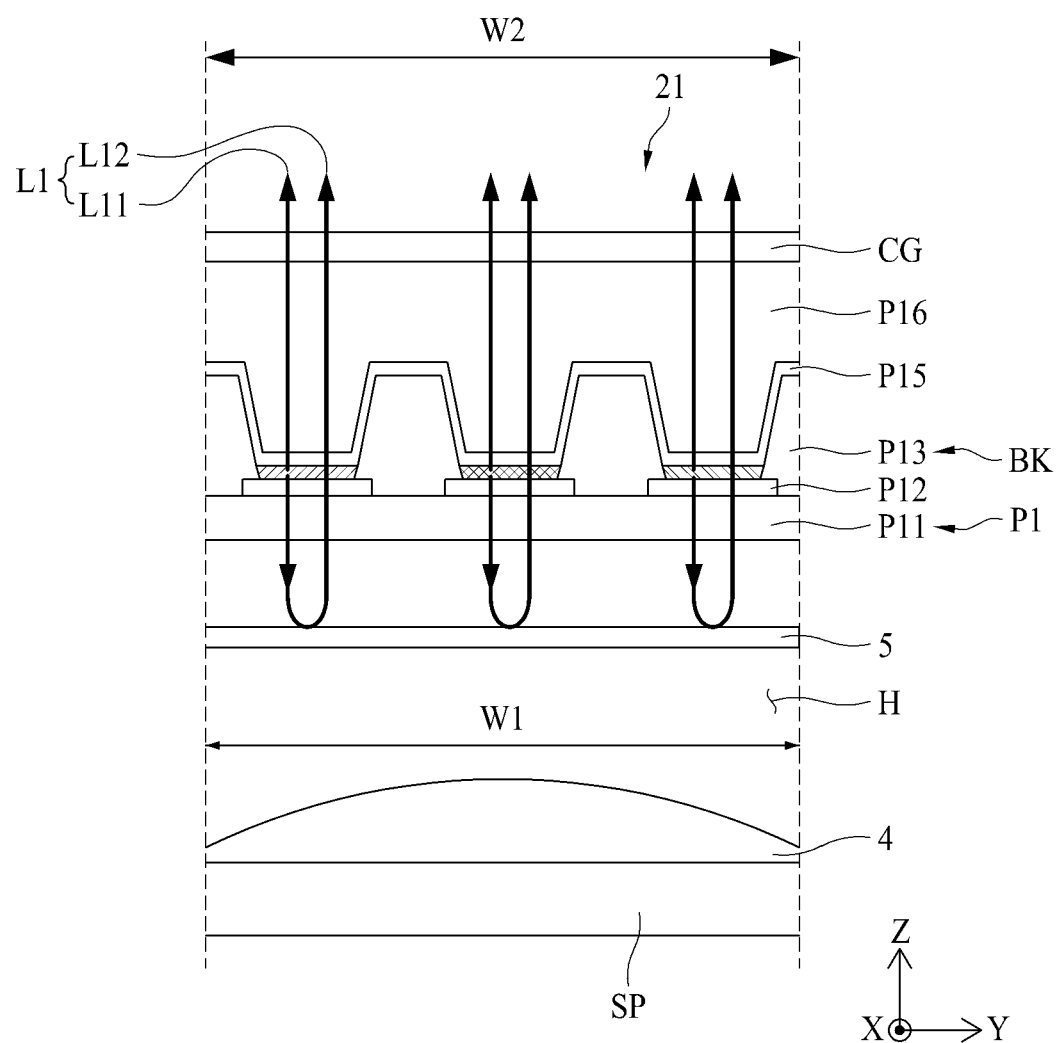
FIG. 3 is a brief view illustrating a portion of FIG. 2A.

FIG. 1 is a brief plane view illustrating a display apparatus according to one aspect of the present disclosure, FIG. 2A is a brief cross-sectional view taken along line I-I shown in FIG. 1, FIG. 2B is a brief enlarged view illustrating a portion F of FIG. 2A, FIG. 2C is a brief enlarged view illustrating a portion G of FIG. 2A, and FIG. 3 is a brief view illustrating a portion of FIG. 2A.

Referring to FIGS. 1 to 3, the display apparatus 1 according to one aspect of the present disclosure comprises a display panel 2, a main body 3, an auxiliary member 4, and a reflective member 5. The display panel 2 includes a first area 21 and a second area 22. The auxiliary member 4 may be arranged inside the main body 3 (or below the display panel 2). The reflective member 5 may movably be provided to overlap the first area 21 or the second area 22. For example, the reflective member 5 may be moved by a moving member 6 to overlap the first area 21 and the second area 22.

In this case, second image light L2 (shown in FIG. 2A) emitted from the second area 22 may be emitted toward a user located outside the display panel 2. First image light L1 (shown in FIG. 2A) emitted from the first area 21 of the display panel 2 may be mixed light of first sub image light L11 directly emitted from the first area 21 toward the user and second sub image light L12 emitted toward the inside (or the reflective member 5) of the main body 3 and reflected in the reflective member 5 and then emitted toward the user. Therefore, the first image light L1 may finally be emitted toward the user.

Since the second area 22 is based on single-sided emission of the display panel 2, the second area 22 may directly emit the second image light L2 toward a user. Since the first area 21 is based on double-sided emission of the display panel 2, the first sub image light L11 directly emitted from the first area 21 toward the user and second sub image light L12 indirectly emitted through the reflective member 5 are mixed with each other.

The present disclosure will be described based on that a user (not shown) is located outside in Z axis direction (shown in FIG. 2A) from the display panel 2. The Z axis direction may mean a thickness direction of the display apparatus 1 according to one aspect of the present disclosure. X axis direction (shown in FIG. 2A) is a direction vertical to the Z axis direction, and may mean a horizontal length (or width) of the display apparatus 1 according to one aspect of the present disclosure. Y axis direction (shown in FIG. 2A) is a direction vertical to each of the Z axis direction and the X axis direction, and may mean a vertical length of the display apparatus 1 according to one aspect of the present disclosure.

The display panel 2 may be a display apparatus emitting image light. The image light may be mixed light of the first image light L1 and the second image light L2. The display panel 2 may be a flexible display panel manufactured using a flexible material such as plastic to maintain display performance even though it is bent like a paper. The display panel 2 according to one example may be a rectangular plate shape on the whole but may be another shape.

The first area 21 of the display panel 2 is a partial area of the display panel 2 arranged to correspond to the auxiliary member 4, and may be provided transparently due to its double-sided emission characteristic. Therefore, the second sub image light L12 emitted from the first area 21 of the display panel 2 to the inside of the main body 3 may be reflected in the reflective member 5 and then emitted to the outside through the first area 21, and external light (not shown) may enter the auxiliary member 4 through the first area 21.

The second area 22 of the display panel 2 is an area except the first area 21 from the display panel 2, and may be provided opaquely due to its single-sided emission characteristic. For example, the second area 22 of the display panel 2 may be provided in a top emission mode to emit the second image light L2 toward a user.

Referring to FIGS. 1 and 2A, the first area 21 of the display panel 2 may be provided to be smaller than the second area 22. This is because that the auxiliary member 4 is smaller than the main body 3.

Meanwhile, the first area 21 may be arranged to be spaced apart from an edge of the display panel 2. In this case, as shown in FIG. 2A, the second area 22 may be arranged at both sides based on the first area 21. Although not shown, the first area 21 may be arranged at the edge of the display panel 2. In this case, the auxiliary member 4 may be arranged below the edge of the display panel 2.

The first area 21 and the second area 22 of the display panel 2 may be areas which are not covered by the main body 3. Therefore, a user may view an image output from the display panel 2 through the first area 21 and the second area 22 of the display panel 2. In FIG. 1, the main body 3 may partially be arranged in a bezel area.

Since the second area 22 is based on single-sided emission, the second image light L2 may be emitted to a user. However, since the first area 21 is based on double-sided emission, the first image light L1 may partially be emitted to the reflective member 5, and the light reflected in the reflective member 5 may partially fail to transmit the first area 21 of the display panel 2. Therefore, luminance of the first image light L1 may be lower than that of the second image light L2.

However, in a general display apparatus, since an auxiliary member such as a camera is externally protruded without being arranged in the display panel, there is no element for outputting an image while being overlapped with the auxiliary member unlike the first area 21 of the display apparatus 1 of the present disclosure, or even though there is an area overlapped with the auxiliary member, the area is provided not to emit an image. Therefore, since the display apparatus 1 according to one aspect of the present disclosure emits image light even from the first area 21 unlike the general display apparatus although luminance of the first image light L1 is lower than that of the second image light L2, the display apparatus 1 according to one aspect of the present disclosure may be provided such that a user has no sense of difference between an image output from the first area 21 and an image output from the second area 22.

Meanwhile, in the display apparatus 1 according to one aspect of the present disclosure, since a luminance difference between the first area 21 and the second area 22 may be reduced using at least one of a drive IC and a thin film transistor, images may be embodied with uniformity such that the a user has no sense of difference for the images, whereby the user's satisfaction may be enhanced. This will be described later in detail.

The first area 21, as shown in FIG. 2A, may be arranged to correspond to the auxiliary member 4. This is to allow the external light to reach the auxiliary member 4 through the first area 21. Therefore, a position of the first area 21 arranged in the display panel 2 may be varied depending on where the auxiliary member 4 is arranged inside the main body 3.

The first area 21 may include a plurality of first pixels P1. The second area 22 may include a plurality of second pixels P2. In the display apparatus 1 according to one aspect of the present disclosure, since the first area 1 and the second area 22 are provided to emit image light, first pixel P1 and the second pixel P2 may be provided at the same size. For example, a width PW1 (shown in FIG. 2B) of the first pixel P1 may be provided to be equal to a width PW2 (shown in FIG. 2C) of the second pixel P2. Therefore, the display apparatus 1 according to one aspect of the present disclosure may be provided such that a user has no sense of difference between the image light output from the first area 21 and the image light output from the second area 22.

The first pixel P1 may include a substrate P11, a first electrode P12, a bank P13, an organic light emitting layer P14, a second electrode P15, an encapsulation layer P16, and a first thin film transistor P17.

The substrate P11 may be a plastic film or a semiconductor substrate such as silicon. The substrate P11 may be made of a transparent material that may transmit the external light and transmit the second sub image light L12 reflected by the reflective member 5.

A plurality of subpixels P may be provided on the substrate P11. The substrate P11 according to one example may include a first subpixel P11a (shown in FIG. 2B) emitting red light, a second subpixel P11b (shown in FIG. 2B) emitting green light, and a third subpixel P11c (shown in FIG. 2B) emitting blue light. The first subpixel P11a, the second subpixel P11b and the third subpixel P11c may be arranged on the substrate P11 to adjoin one another. Each of the first subpixel P11a, the second subpixel P11b and the third subpixel P11c may be provided to include a first electrode P12, an organic light emitting layer P14, and a second electrode P15.

A circuit element comprising a plurality of first thin film transistors P17, various types of signal lines and a capacitor may be provided per each of the subpixels in the substrate P11. The signal lines may include gate lines, data lines, power lines and reference lines, and the first thin film transistor P17 may include a switching thin film transistor, a driving thin film transistor, and a sensing thin film transistor. The subpixels are defined by an intersection structure of the gate lines and the data lines.

The switching thin film transistor is switched in accordance with a gate signal supplied to the gate line and serves to supply a data voltage supplied from the data line to the driving thin film transistor.

The driving thin film transistor is switched in accordance with the data voltage supplied from the switching thin film transistor to generate a data current from a power source supplied from the power line, and serves to supply the generated data current to the first electrode P12.

The sensing thin film transistor serves to sense a threshold voltage deviation of the driving thin film transistor, which is a cause of image quality degradation, and supplies a current of the driving thin film transistor to the reference line in response to a sensing control signal supplied from the gate line or a separate sensing line.

The capacitor serves to maintain the data voltage supplied to the driving thin film transistor for one frame and is connected to each of a gate terminal and a source terminal of the driving thin film transistor.

The first thin film transistor P17 may include a first sub thin film transistor, a second sub thin film transistor, and a third sub thin film transistor. The first sub thin film transistor, the second sub thin film transistor and the third sub thin film transistor are arranged for each of the subpixels P11a, P11b and P11c in the substrate P11. The first sub thin film transistor according to one example may be connected to a first sub electrode arranged on the first subpixel P11a to apply a driving voltage for emitting light of a color corresponding to the first subpixel P11a.

The second sub thin film transistor according to one example may be connected to a second sub electrode arranged on the second subpixel P11b to apply a driving voltage for emitting light of a color corresponding to the second subpixel P11b.

The third sub thin film transistor according to one example may be connected to a third sub electrode arranged on the third subpixel P11c to apply a driving voltage for emitting light of a color corresponding to the third subpixel P11c.

Each of the first subpixel P11a, the second subpixel P11b and the third subpixel P11c according to one example supplies a predetermined current to the organic light emitting layer in accordance with the data voltage of the data line when a gate signal from the gate line is input thereto using each of the sub thin film transistors. For this reason, the organic light emitting layer of each of the first subpixel P11a, the second subpixel P11b and the third subpixel P11c may emit light with a predetermined brightness in accordance with the predetermined current.

The first electrode P12 is formed on the substrate P11. The first electrode P12 according to one example may be provided transparently to transmit external light or transmit the second sub image light L12 reflected in the reflective member 5 to the outside. For example, the first electrode P12 may be formed of a transparent conductive material (TCO) such as ITO and IZO, which can transmit light. The first electrode P12 may include a first sub electrode provided in the first subpixel P11a, a second sub electrode provided in the second sub electrode P11b and a third sub electrode provided in the third subpixel P11c.

The first sub electrode is formed on the substrate P11, and is connected to a source electrode of the first sub thin film transistor through a contact hole passing through a portion of the substrate P11.

The second sub electrode is formed on the substrate P11, and is connected to a source electrode of the second sub thin film transistor through a contact hole passing through a portion of the substrate P11.

The third sub electrode is formed on the substrate P11, and is connected to a source electrode of the third sub thin film transistor through a contact hole passing through a portion of the substrate P11.

In this case, the first to third sub thin film transistors may be N-type TFTs.

If the first to third sub thin film transistors are provided as P-type TFTs, each of the first to third sub electrodes may be connected to a drain electrode of each of the first to third sub thin film transistors.

That is, each of the first to third sub electrodes may be connected to a source electrode or a drain electrode in accordance with types of the first to third sub thin film transistors.

The display apparatus 1 according to one aspect of the present disclosure may further comprise a plurality of banks BK for partitioning the first subpixel P11a and P21a, the second subpixel P11b and P21b, and the third subpixel P11c and P21c from one another.

The bank BK may be provided to cover edges of the first sub electrode, the second sub electrode and the third sub electrode, thereby partitioning the first subpixel P11a and P21a, the second subpixel P11b and P21b, and the third subpixel P11c and P21c from one another. The bank BK serves to define the subpixels, that is, a light emitting portion. Also, since an area where the bank BK is formed does not emit light, the area may be defined as a non-light emitting portion. The bank BK may be formed of an organic film such as acryl resin, epoxy resin, phenolic resin, polyamide resin, and polyimide resin. The bank BK may include a first bank P13, and a second bank P23. Since the first area 21 should be provided transparently, the first bank P13 arranged in the first area 21 may be provided transparently.

The organic light emitting layer P14 is arranged on the first electrode P12. The organic light emitting layer P14 according to one example may include a hole transporting layer HTL, a light emitting layer EML, a hole blocking layer HBL, and an electron transporting layer ETL. The organic light emitting layer P14 may further include a hole injecting layer HIL, an electron blocking layer EBL, and an electron injecting layer EIL.

The hole injecting layer HIL, the hole transporting layer HTL, the electron transporting layer ETL, and the electron injecting layer EIL of the organic light emitting layer P14 are intended to improve emission efficiency of the light emitting layer EML. The hole transporting layer HTL and the electron transporting layer ETL are intended for balance of electrons and holes. The hole injecting layer HIL and the electron injecting layer EIL are intended to enhance injection of electrons and holes.

In more detail, the hole injecting layer HIL may facilitate hole injection by lowering injection energy barrier of holes injected from an anode material. The hole transporting layer HTL serves to transport holes injected from an anode to the light emitting layer without loss.

The light emitting layer EML is a layer for emitting light through recombination of holes injected from an anode and electrons injected from a cathode, and may emit light of red, blue and green colors in accordance with combination energy inside the light emitting layer and form a white light emitting layer by configuring a plurality of light emitting layers. The hole blocking layer HBL may be provided between the light emitting layer EML and the electron transporting layer ETL to block movement of holes which are not combined with electrons in the light emitting layer EML. The electron blocking layer EBL is provided between the light emitting layer EML and the hole transporting layer HTL and serves to trap electrons in the light emitting layer EML to allow the electrons not to move from the light emitting layer EML to the hole transporting layer HTL.

The electron transporting layer ETL serves to transport the electrons injected from the cathode to the light emitting layer. The electron injecting layer EIL serves to facilitate injection of the electrons from the cathode by lowering a potential barrier during injection of the electrons.

If a high potential voltage is applied to the first electrode P12 and a low potential voltage is applied to the second electrode P15, holes and electrons are moved to the organic light emitting layer P14 through the hole transporting layer and the electron transporting layer, respectively and combined with each other in the organic light emitting layer P14 to emit light.

The organic light emitting layer P14 may include a first organic light emitting layer P14a provided on the first sub electrode, a second organic light emitting layer P14b provided on the second sub electrode, and a third organic light emitting layer P14c provided on the third sub electrode. The first organic light emitting layer P14a, the second organic light emitting layer P14b and the third organic light emitting layer P14c may be provided in one pixel. In this case, one pixel may mean, but is not limited to, one pixel capable of embodying white light by combination of red light, green light and blue light.

As described above, each of the first to third organic light emitting layers P14a, P14b and P14c may include a hole injecting layer, a hole transporting layer, an electron blocking layer, a light emitting layer, a hole blocking layer, an electron transporting layer, and an electron injecting layer.

If the first organic light emitting layer P14a, the second organic light emitting layer P14b and the third organic light emitting layer P14c are provided to emit red (R) light, green (G) light and blue (B) light, an arrangement sequence of the first to third organic light emitting layers P14a, P14b and P14c for the first to third sub electrodes may be combined in various ways. As the first organic light emitting layer P14a, the second organic light emitting layer P14b and the third organic light emitting layer P14c emit red (R) light, green (G) light and blue (B) light, the display apparatus 1 according to one aspect of the present disclosure may not use a color filter, whereby the manufacturing cost may be reduced as compared with the case that a color filter is used. Also, as the display apparatus 1 according to one aspect of the present disclosure does not use a color filter, transmittance of the external light and transmittance of the second sub image light L12 may be improved.

The second electrode P15 is arranged on the organic light emitting layer P14. The second electrode P15 according to one example is a common layer commonly formed in the first subpixel P11a, the second subpixel P11b and the third subpixel P11c. The second electrode P15 may be formed of a transparent conductive material (TCO) such as ITO and IZO, which can transmit light.

Referring to FIG. 2B again, the encapsulation layer P16 may be formed on the second electrode P15. The encapsulation layer P16 serves to prevent oxygen or water from being permeated into the organic light emitting layer P14 and the second electrode P15. To this end, the encapsulation layer P16 may include at least one inorganic film and at least one organic film.

For example, the encapsulation layer P16 may include a first inorganic film, an organic film, and a second inorganic film. In this case, the first inorganic film is formed to cover the second electrode P15. The organic film is formed to cover the first inorganic film. The organic film may be formed at a length long enough to prevent particles from being permeated into the organic light emitting layer P14 and the second electrode P15 by passing through the first inorganic film. The second inorganic film is formed to cover the organic film.

Meanwhile, as shown in FIG. 2A, the display apparatus 1 according to one aspect of the present disclosure may further comprise a cover glass CG.

The cover glass CG is intended to protect the encapsulation layer P16, the second electrode P15, the organic light emitting layer P14, the first electrode P12 and the substrate P11 so as not to be damaged from particles such as water and dust and external impact. The cover glass CG may be arranged on the encapsulation layer P16. The cover glass CG may be arranged even in the second area 22.

Consequently, in the display apparatus 1 according to one aspect of the present disclosure, the first area 21 may be provided transparently such that the external light may be emitted toward the auxiliary member 4 or the second sub image light L12 reflected by the reflective member 5 may be emitted to the outside. In more detail, the substrate P11, the first electrode P12, the first bank P13 and the second electrode P15, which are arranged in the first area 21, may be provided transparently. The encapsulation layer P16 and the first thin film transistor P17, which are arranged in the first area 21, may be provided transparently. However, if the first thin film transistor P17 may be arranged in the second area 22 not the first area 21, the first thin film transistor P17 may not be provided transparently.

The second pixel P2 includes a substrate P21, a first electrode P22, a second bank P23, an organic light emitting layer P24, a second electrode P25, an encapsulation layer P26, and a second thin film transistor P27. Since the second pixel P2 is based on single-sided emission, elements of the second pixel P2 are the same as the substrate P11, the first electrode P12, the first bank P13, the organic light emitting layer P14, the second electrode P15, the encapsulation layer P16, and the first thin film transistor P17 of the first pixel P1 except that some of the second pixel P2 are provided opaquely. Therefore, the elements provided opaquely will be described hereinafter.

First of all, referring to FIG. 2C, unlike the first area 21 overlapped with the auxiliary member 4, the second area 22 is based on a single sided emission and may be provided opaquely to enhanced luminance of image light for a user. Therefore, in the second pixel P2, the elements arranged below the organic light emitting layer P24 may be made of a reflective material or provided opaquely such that light emitted from the organic light emitting layer P24 may be emitted to a user. For example, the first electrode P22 of the second pixel P2 may be provided as a reflective electrode, and the substrate P21, the second bank P23 and the second thin film transistor P27 may be provided opaquely.

However, the elements arranged above the organic light emitting layer P24, for example, the second electrode P25 and the encapsulation layer P26 of the second pixel P2 may be provided transparently to improve transmittance of light emitted from the organic light emitting layer P24 to the upper portion in the same manner as the second electrode P15 and the encapsulation layer P16 of the first pixel P1.

Meanwhile, the first organic light emitting layer P24a, the second organic light emitting layer P24b and the third organic light emitting layer P24c of the second pixel P2 may be provided to emit red light, green light and blue light in the same manner as the first organic light emitting layer P14a, the second organic light emitting layer P14b and the third organic light emitting layer P14c of the first pixel P1.

In the display apparatus 1 according to one aspect of the present disclosure, since the first area 21 should be provided transparently and the second area 22 should be provided opaquely, a difference in process between the elements arranged in the first area 21 and the elements arranged in the second area 22 may occur.

For example, since the substrate P11 arranged in the first area 21 should be provided transparently and the substrate P12 arranged in the second area 22 should be provided opaquely, after a transparent substrate is entirely arranged in the first area 21 and the second area 22, an opaque material may further be formed on only the substrate in the second area 22, whereby the substrate P11 arranged in the first area 21 may be provided transparently and the substrate P21 arranged in the second area 22 may be provided opaquely.

For another example, a transparent material may be deposited on the first area 21 to form the transparent substrate P11, and an opaque material may be deposited on the second area 22 to form the opaque substrate P21.

Similarly to the above process, the first electrode P12 and the first bank P13 arranged in the first area 21 may be provided transparently, and the first electrode P22 and the second bank P23 arranged in the second area 22 may be provided opaquely.

Since the second electrode P15 arranged in the first area 21 and the second electrode P25 arranged in the second area 22 should be provided transparently, the second electrode P15 and the second electrode P25 may be provided in the first area 21 and the second area 22 transparently by one process.

Referring to FIG. 1 again, the main body 3 is intended to support the display panel 2. The main body 3 forms an overall external appearance of the display apparatus 1 according to one aspect of the present disclosure, and may be made of, but not limited to, a hollow cuboid shape. The display panel 2 may be coupled to the main body 3 and supported by the main body 3. The display panel 2 may be coupled to the main body 3 through an adhesive member 5 such as resin and double-sided tape.

The main body 3 may include a storage space (not shown). The storage space is intended to store a driving device such as a battery, a printed circuit board, etc, for driving the display panel 2, and the auxiliary member 4. The storage space may be provided by, but not limited to, the display panel 2 and the main body 3. The storage space may be provided by only the main body 3 if it may store the driving device and the auxiliary member 4. The main body 3 may be formed of a metal material for rigidity, but may be formed of a plastic material for weight lightening.

The main body 3 may be formed to be greater than the display panel 2 so as to surround the display panel 2, and therefore may prevent the display panel 2 from being damaged from external impact. Therefore, the main body 3, as shown in FIG. 1, may be arranged at the outmost of the display apparatus 1 according to one aspect of the present disclosure.

The auxiliary member 4 includes devices arranged inside the main body 3, for example, a camera, a proximity sensor, an illumination sensor, and a speaker. Since the display apparatus 1 according to one aspect of the present disclosure is embodied as a full screen display, the auxiliary member 4 may be arranged in the storage space of the main body 3 such that the auxiliary member 4 may not be externally protruded. Hereinafter, a description will be given based on that the auxiliary member 4 is a camera, for example.

Since the auxiliary member 4 is arranged inside the main body 3 or below the display panel 2, the first area 21 may be provided transparently such that the external light may enter the auxiliary member 4. The first area 21 may be formed at, but not limited to, the same size as that of the auxiliary member 4. The first area 21 may be provided to be greater than the auxiliary member 4 to allow the external light to enter the auxiliary member 4 well. On the other hand, if the first area 21 is provided to be smaller than the auxiliary member 4, the amount of the external light entering the auxiliary member 4 may be reduced to reduce the amount of the external light sensed by the auxiliary member 4, whereby a problem may occur in that a camera image becomes blur.

Meanwhile, the auxiliary member 4 may be arranged to be spaced from the substrate P11 arranged in the first area 21 toward the inside of the main body 3 at a predetermined distance. In the display apparatus 1 according to one aspect of the present disclosure, the first pixel P1 may be arranged such that the first image light L1 may be emitted even from the first area 21. If the auxiliary member 4 is in contact with the substrate P11, the reflective member 5 cannot be arranged between the auxiliary member 4 and the substrate P11, whereby the second sub image light L12 emitted from the first area 21 toward the inside of the main body 3 cannot be reflected toward the outside. Therefore, as shown in FIG. 2A, the auxiliary member 4 may be arranged to be spaced apart from the substrate P11 at a predetermined distance, and the reflective member 5 may be arranged between the auxiliary member 4 and the substrate P11. That is, the reflective member 5 may be arranged between the auxiliary member 4 and the display panel 2.

The reflective member 5 is intended to reflect the second sub image light L12. The reflective member 5 may be, but not limited to, a mirror. The reflective member 5 may be made of a metal material that may reflect light. For another example, since the reflective member 5 has only to reflect the light emitted from the first area 21 to the inside of the main body 3, only the upper surface arranged to be closest to the first area 21 from the reflective member 5 may be made of a reflective material. That is, the reflective member 5 may be provided in a mixed structure of a reflective material and another material.

In the display apparatus 1 according to one aspect of the present disclosure, the first pixel P1 may be arranged even in the first area 21 to minimize a sense of difference based on a luminance difference between the first area 21 and the second area 22, which are overlapped with the auxiliary member 4, and the first area 21 may be provided transparently such that the auxiliary member 4 arranged below the first area 21 may absorb the external light. Therefore, a portion of the light emitted from the first area 21 may directly be emitted to the outside like the first sub image light L11, and the other portion of the light may emitted toward the inside (or the auxiliary member 4) of the main body 3 like the second sub image light L12, whereby the first image light L1 emitted from the first area 21 has no choice but to have luminance lower than that of the second image light L2 emitted from the second area 22. For example, supposing that there is no reflective member 5, if luminance of the second image light L2 is 100, luminance of the first image light L1 may be 34.7, approximately. In this case, luminance of the first image light L1 may be luminance of the first sub image light L11 only. This is because that the second sub image light L12 emitted from the first image light L1 to the inside of the main body 3 cannot be emitted to the outside. Luminance of the second sub image light L12 emitted from the first image light L1 to the inside of the main body 3 may be 65.3, approximately. This luminance value is a value calculated through simulation under the assumption that there is no reflective member 5.

Therefore, in the display apparatus 1 according to one aspect of the present disclosure, the reflective member 5 is arranged between the first area 21 and the auxiliary member 4 to reflect the second sub image light L12 headed for the inside of the main body 3 to the outside, whereby luminance of the first area 21 may be improved.

For example, supposing that luminance of the second image light L2 is 100, since luminance of the first image light L1 is luminance obtained by adding the first sub image light L11 to the second sub image light L12 reflected by the reflective member 5, the luminance of the first image light L1 may be 69.4, approximately. Luminance of the first sub image light L11 directly emitted from the organic light emitting layer P14 arranged in the first area 21 to the outside is 34.7, approximately and luminance of the second sub image light L12 emitted from the organic light emitting layer P14 to the inside of the main body 3 (or the auxiliary member 4) is 65.3, approximately. The second sub image light L12 may be reflected in the reflective member 5 and then transmit the substrate P11, the first electrode P12, the organic light emitting layer P14, the second electrode P15, the encapsulation layer P16 and the cover glass CG, which are arranged above the reflective member 5, whereby luminance of the second sub image light L12 may be reduced to 34.7. Consequently, luminance of the first image light L1 may be 69.4, approximately, by addition of 34.7 which is luminance of the first sub image light L11 and 34.7 which is luminance of the second sub image light L12 emitted by being reflected in the reflective member 5. That is, if luminance of the second image light L2 is 100, luminance of the first image light L1 may be 69.4 less than 100.

Although not shown, the second sub image light L12 reflected in the reflective member 5 may be emitted to the outside through the first bank P13 provided transparently.

Meanwhile, although the plurality of subpixels are partitioned by the bank as described above, a trench not the bank may be provided between the respective subpixels to partition the subpixels. The trench may be formed in such a manner that the substrates P11 and P21 arranged between the first electrodes P12 and P22 are removed by being patterned at a predetermined depth, thereby partitioning the respective subpixels from each other. In this case, the second electrodes P15 and P25 may be provided to cover the trench.

A size of the reflective member 5 may be provided to be equal to or greater than the size of the first area 21. For example, as shown in FIG. 3, a width W1 of the reflective member 5 may be provided to be equal to a width W2 of the first area 21. Therefore, the reflective member 5 may reflect most of the second sub image light L12, which is emitted from the organic light emitting layer P14 to the inside of the main body 3, toward the outside. If the size of the reflective member 5 is smaller than the size of the first area 21, the second sub image light L12 emitted toward the inside of the main body 3 may partially enter the auxiliary member 4 without being fully reflected by the reflective member 5. Then, since the amount of the second sub image light L12 reflected in the reflective member 5 and emitted to the outside is reduced, whole luminance of the first image light L1 may be reduced.

Therefore, in the display apparatus 1 according to one aspect of the present disclosure, as the reflective member 5 may be provided to be equal to or greater than the size of the first area 21, the amount of the second sub image light L12 reflected in the reflective member 5 and emitted to the outside may be increased to improve luminance of the first image light L1.

Meanwhile, since the reflective member 5 is arranged to overlap the first area 21, the reflective member 5 should move to another position so as not to overlap the first area 21, whereby the auxiliary member 4 may absorb the external light when the auxiliary member 4 is driven. Therefore, the display apparatus 1 according to one aspect of the present disclosure may further comprise a moving member 6.

Figure 4A:
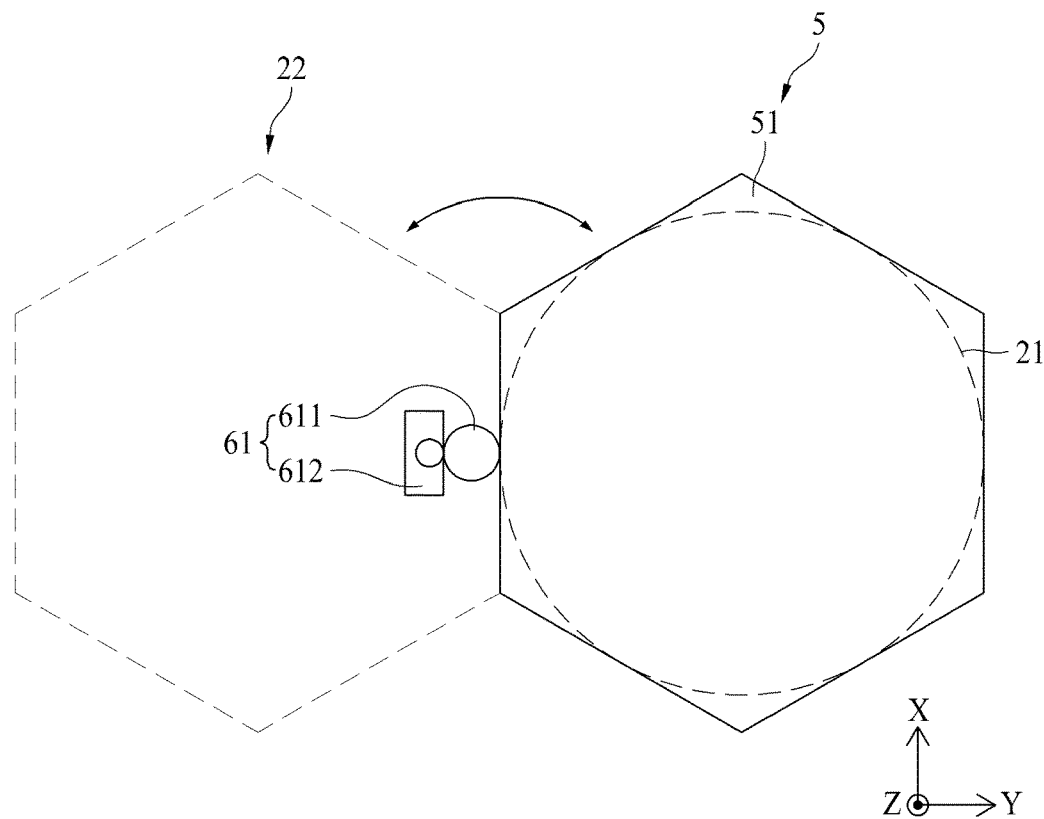
FIG. 4A is a brief plane view illustrating a reflective member and a moving member of a display apparatus according to a first aspect of the present disclosure.
Figure 4B:
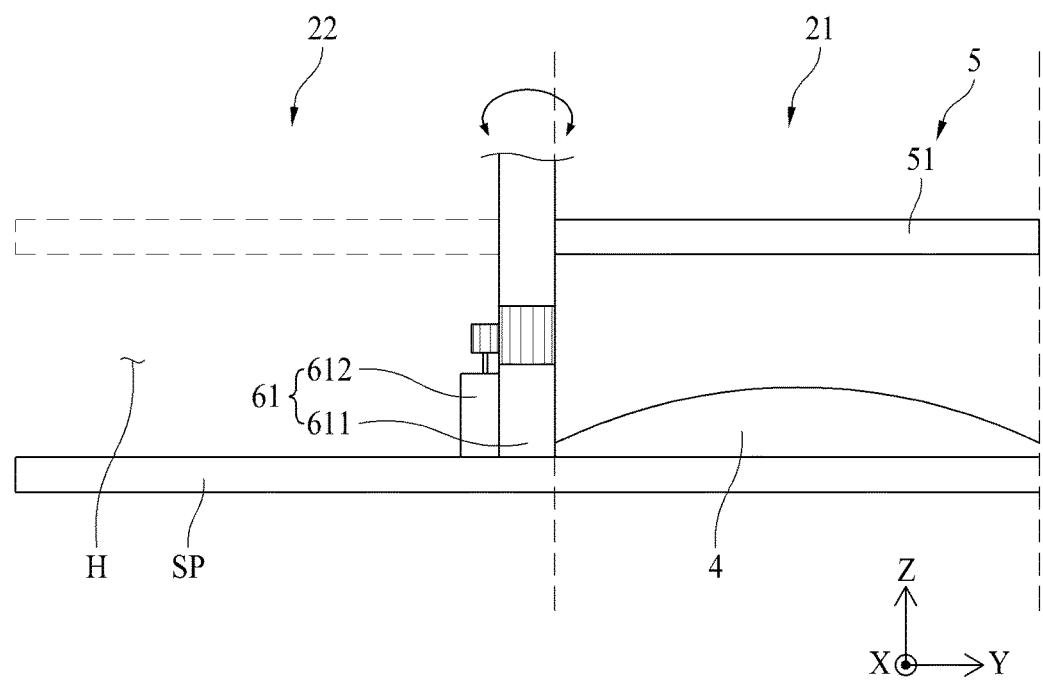
FIG. 4B is a brief side view illustrating a reflective member and a moving member of a display apparatus according to a first aspect of the present disclosure.
Figure 5A:
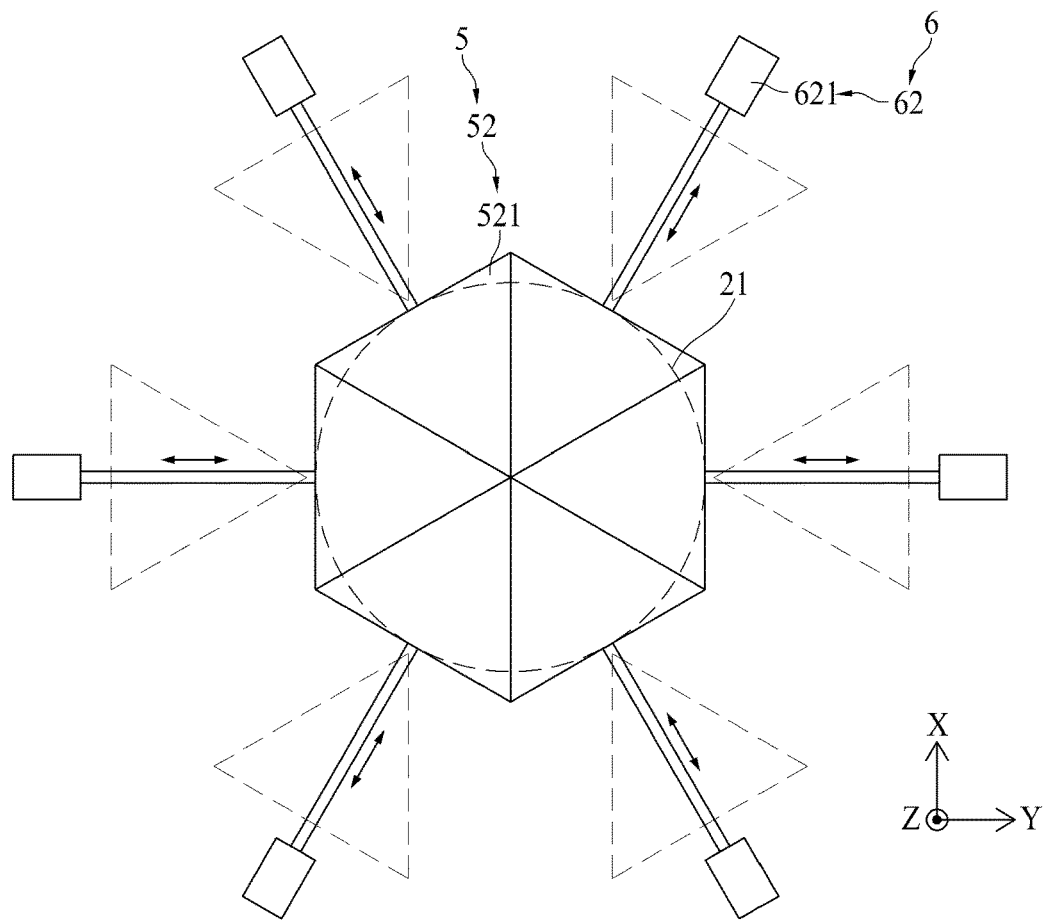
FIG. 5A is a brief plane view illustrating a reflective member and a moving member of a display apparatus according to the second aspect of the present disclosure.
Figure 5B:
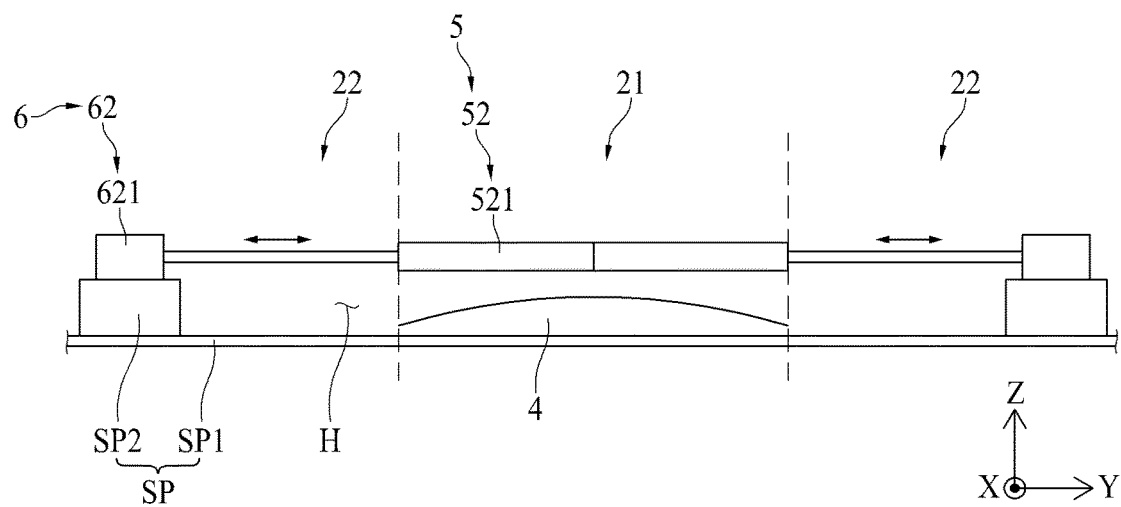
FIG. 5B is a brief side view illustrating a reflective member and a moving member of a display apparatus according to the second aspect of the present disclosure.
Figure 6A:
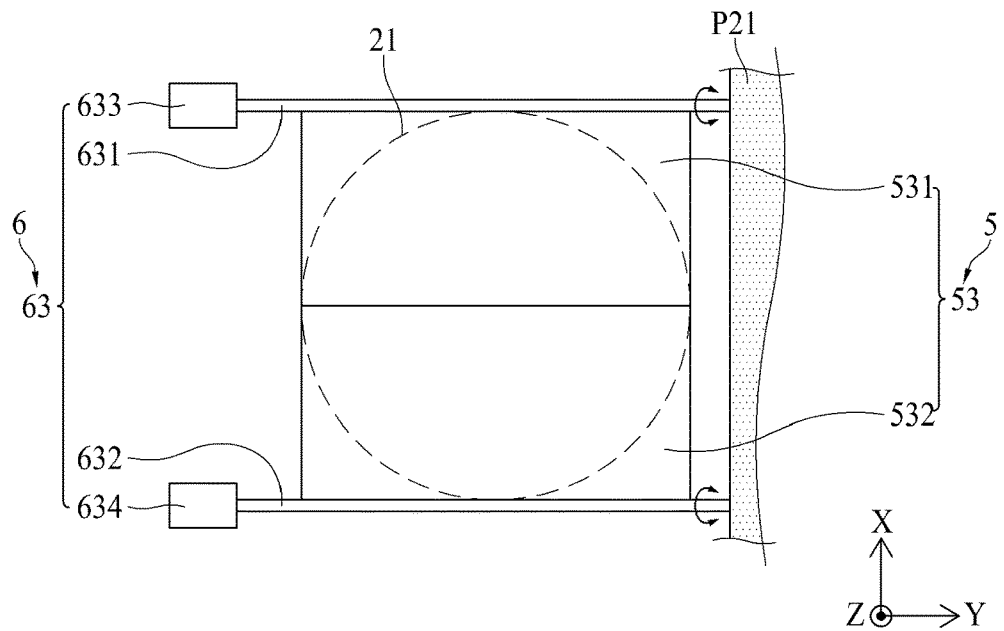
FIG. 6A is a brief plane view illustrating a reflective member and a moving member of a display apparatus according to the third aspect of the present disclosure.
Figure 6B:
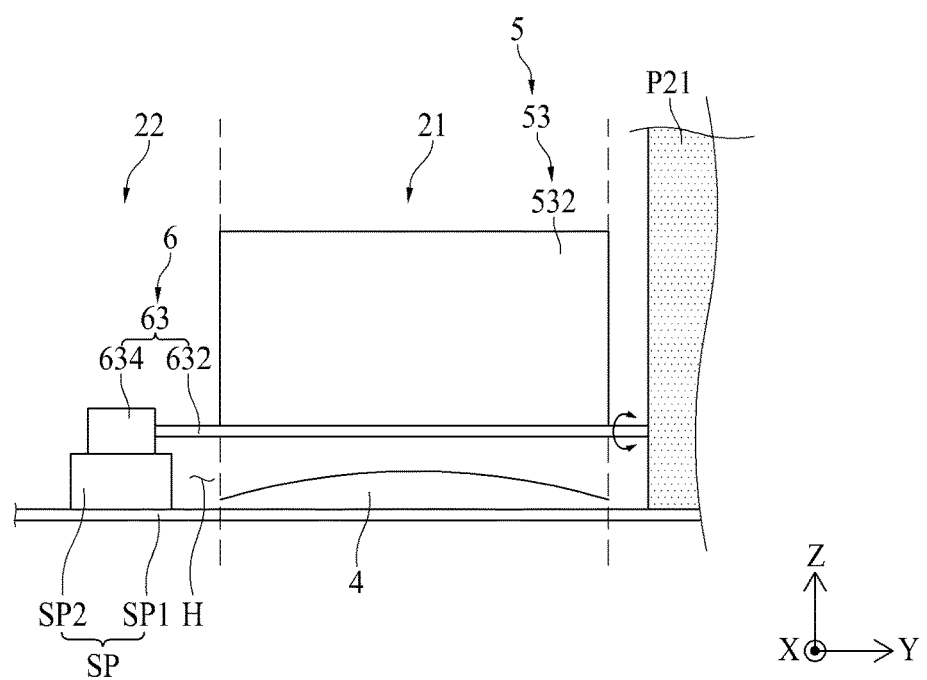
FIG. 6B is a brief side view illustrating a reflective member and a moving member of a display apparatus according to the third aspect of the present disclosure.

FIG. 4A is a brief plane view illustrating a reflective member and a moving member of a display apparatus according to a first aspect of the present disclosure, FIG. 4B is a brief side view illustrating a reflective member and a moving member of a display apparatus according to the first aspect of the present disclosure, FIG. 5A is a brief plane view illustrating a reflective member and a moving member of a display apparatus according to the second aspect of the present disclosure, FIG. 5B is a brief side view illustrating a reflective member and a moving member of a display apparatus according to the second aspect of the present disclosure, FIG. 6A is a brief plane view illustrating a reflective member and a moving member of a display apparatus according to the third aspect of the present disclosure, and FIG. 6B is a brief side view illustrating a reflective member and a moving member of a display apparatus according to the third aspect of the present disclosure.

Referring to FIG. 2A and FIGS. 4A to 6B, the moving member 6 is intended to move the reflective member 5. The moving member 6 may move the reflective member 5 to overlap the first area 21 or the second area 22. The moving member 6 may be arranged in a groove H (shown in FIG. 2A) formed in the substrate P11 arranged in the first area 21 and the substrate P21 arranged in the second area 22 to move the reflective member 5. In this case, as shown FIG. 2A, at least a portion of the substrate P11 arranged in the first area 21 may be provided to have a thickness different from that of at least a portion of the substrate P21 arranged in the second area 22.

Although not shown, the substrate P11 arranged in the first area 21 and the substrate P21 arranged in the second area 22 may be provided at the same thickness, and an insertion member provided with a groove H may be arranged between the substrates P11 and P12 and a support member SP as shown in FIG. 2A. In this case, the moving member 6 may be inserted into the groove H provided in the insertion member to move the reflective member 5.

The groove H may be provided to have a size equal to or greater than a rotational radius of the reflective member 5. If the size of the groove H is smaller than the rotational radius of the reflective member 5, the reflective member 5 cannot be arranged in the second area 22 due to the substrates P11 and P21. The size and position of the groove H may be varied depending on a shape of the moving member 6, a method for moving the reflective member 5, and a shape of the reflective member 5.

The aspects of the display apparatus 1 may be categorized in accordance with the method for moving the reflective member 5 by the moving member 6 and the shape of the reflective 5. For example, the moving member 6 may include a first moving member 61 according to one aspect, a second moving member 62 according to the second aspect, and a third moving member 63 according to the third aspect. Likewise, the reflective member 5 may include a first reflective member 51 according to one aspect, a second reflective member 52 according to the second aspect, and a third reflective member 53 according to the third aspect.

First of all, referring to FIGS. 4A and 4B, the first moving member 61 according to one aspect may include a rotary shaft 611 and a driver 612.

The rotary shaft 611 is arranged in parallel with Z axis direction in a cylindrical shape, and may have one side rotatably coupled to the substrate P21 arranged in the second area 22 and the other side rotatably coupled to the support member SP (shown in FIG. 2A) arranged in the second area 22. The support member SP is a plate provided inside the main body 3, and may be coupled with the substrate P21 arranged in the second area 22. Therefore, the support member SP may be coupled to the main body 3 to support the substrate P21 and the rotary shaft 611. On the other hand, the substrate P11 arranged in the first area 21 cannot be coupled to the support member SP due to the auxiliary member 4 and the reflective member 5. The rotary shaft 611 may be rotated by the driver 612 clockwise or counterclockwise in a state that the rotary shaft 611 is supported in the support member SP and the second substrate P21.

The driver 612 provides a driving force to rotate the rotary shaft 611. The driver 612 according to one example may be arranged in parallel with the rotary shaft 611 to provide a driving force to the rotary shaft 611. In more detail, the driver 612 may include a body portion and a head portion, wherein the body portion may be fixedly coupled to the support member SP, and the head portion may be formed in a sawteeth type gear and then engaged with a groove formed in the rotary shaft 611. The head portion may rotate the rotary shaft 611 clockwise or counterclockwise while being rotated by a driving force provided by the body portion. The driver 612 may be a motor, but may be another device if it may provide a driving force.

Meanwhile, as shown in FIGS. 4A and 4B, the first reflective member 51 according to one example may be provided in, but not limited to, one hexagon. If the first reflective member 51 may be provided to be greater than the first area 21 to reflect the second sub image light L12, the first reflective member 51 may be provided in another shape such as a circle. As shown in FIG. 4A, in order that the first reflective member 51 is overlapped with the second area 22 when the auxiliary member 4 is driven, the first reflective member 51 should be rotated at an angle of 180°, approximately. Therefore, the driver 612 may be arranged below or above the first reflective member 51 in Z axis direction and therefore may not interfere with the first reflective member 51 when the first reflective member 51 is rotated. Although FIG. 4B shows that the driver 612 is arranged below the first reflective member 51, the driver 612 may be arranged above the first reflective member 51.

If the driver 612 is arranged below the first reflective member 51 as shown in FIG. 4B, a space for arrangement of the driver 612 may be provided between the first reflective member 51 and the support member SP. Although FIG. 4B shows that the driver 612 is directly connected to the rotary shaft 611, the driver 612 may indirectly be connected to the rotary shaft 611 through a connection member such as a gear or belt. However, even in this case, the driver 612 may be arranged in the second area 22 so as not to interfere with the external light entering the auxiliary member 4.

The first moving member 61 according to one aspect may open or block a portion between the first area 21 of the display panel 2 and the auxiliary member 4 by using one driver 612 and one reflective member 51 but is not limited to this example.

Next, referring to FIGS. 5A and 5B, the second moving member 62 according to the second aspect may include a plurality of pistons 621. The second reflective member 52 according to the second aspect may include a plurality of sub reflective members 521.

A combined shape of the plurality of sub reflective members 521 may be a hexagon on the whole, and each of the sub reflective members 521 may be formed in a triangle as shown in FIG. 5A. The sub reflective members 521 may be moved to overlap the second area 22 by a plurality of pistons 621. On the contrary, the sub reflective members 521 may be moved to overlap the first area 21. The sub reflective members 521 may be moved to overlap the second area 22 when the auxiliary member 4 is driven, and may be moved to overlap the first area 21 when the auxiliary member 4 is not driven.

The plurality of pistons 621 may respectively be coupled to the sub reflective members 521. As shown in FIG. 5A, the plurality of pistons 621 may be spaced apart from one another and arranged in the second area 22 to surround the first area 21. Each of the plurality of pistons 621 may include a body portion and a bar. The body portion may be fixedly coupled from the second area 22 to the support member SP to surround the first area 21. One side of the bar may movably be coupled to the body portion, and the other side of the bar may be coupled to the sub reflective members 521. When the auxiliary member 4 is driven, the body portion may pull the bar from the first area 21 to the second area 22 to move the sub reflective members 521 to the second area 22. In this case, the sub reflective members 521 may move in different directions and therefore may be more spaced apart from one another. On the contrary, when the auxiliary member 4 is not driven, the body portion may push the bar from the second area 22 to the first area 21 to move the sub reflective members 521 to the first area 21. In this case, the sub reflective members 521 may move toward the center of the first area 21, whereby the other portions except the portion coupled to the piston 621 may be in contact with one another. Therefore, when viewed from a plane as shown in FIG. 5A, since a gap is not generated between the respective sub reflective members 521, most of the second sub image light L12 headed for the inside of the main body 3 from the organic light emitting layer P14 may be reflected to the outside. For example, the piston 621 may be an electric piston.

Referring to FIG. 5B, the support member SP may include a first support member SP1 and a second support member SP2. The first support member SP1 may be coupled to the main body 3 as a part of the support member SP according to one example. The second support member SP2 is intended for balance of a height of the pistons 621 with a height of the sub reflective members 521, and may be arranged between the pistons 621 and the first support member SP1. As shown in FIG. 5B, the second support member SP2 may be formed to be equal to or thicker than a thickness of the auxiliary member 4, whereby the pistons 621 and the sub reflective members 521 may be arranged in almost parallel with Y axis direction. Since the second moving member 62 according to the second aspect is not arranged below the second reflective member 52, a whole thickness of the display apparatus 1 may be reduced as compared with the first aspect. The second moving member 62 may move a plurality of sub reflective members 521 to overlap the first area 21 or the second area 22.

Meanwhile, although the second moving member 62 is a piston as described above, the second moving member 62 may be provided in a cylinder type using a hydraulic cylinder or pneumatic cylinder, a ball screw type using a motor and ball screw, a gear type using a motor, a rack gear and a pinion gear, a belt type using a motor, pulley, and belt, and a linear motor using a coil and permanent magnet without limitation to the piston.

Although FIG. 5A shows that six sub reflective members 521 are provided in a hexagon, two or more the sub reflective members may be provided in another shape if it may reflect the second sub image light L12 headed for the inside of the main body 3 from the organic light emitting layer P14 to the outside. For example, two sub reflective members 521 may be provided in a rectangular shape to reflect the second sub image light L12 headed for the inside of the main body 3 to the outside.

Next, referring to FIGS. 6A and 6B, the third moving member 63 according to the third aspect may include a first rotary shaft 631, a second rotary shaft 632, a first driver 633 and a second driver 634. The third reflective member 53 according to the third aspect may include a first sub reflective member 531 and a second sub reflective member 532.

Each of the first sub reflective member 531 and the second sub reflective member 532 may be formed in a rectangular shape. If the first sub reflective member 531 and the second sub reflective member 532 are in contact with each other, as shown in FIG. 6A, the first sub reflective member 531 and the second sub reflective member 532 may be formed in a rectangular shape greater than the first area 21 as shown in FIG. 6A. Therefore, the first sub reflective member 531 and the second sub reflective member 532 may reflect most of the second sub image light L12 headed for the inside of the main body 3 toward the first area 21.

The first rotary shaft 631 is arranged in parallel with Y axis direction in a cylindrical shape, and may have one side rotatably coupled to the substrate P21 arranged in the second area 22 and the other side coupled to the first driver 633 arranged in the second area 22. The first rotary shaft 631 may be formed at a length longer than the first area 21 to connect the substrate P21 with the second driver 633 based on the first area 21.

One side of the first sub reflective member 531 may be coupled to the first rotary shaft 631. As the first rotary shaft 631 is rotated by the first driver 633, the first sub reflective member 531 may be rotated clockwise or counterclockwise. If the first sub reflective member 532 is rotated at 90° or more clockwise, the other side of the first sub reflective member 531 arranged in parallel with one side of the first sub reflective member 531 may be spaced apart from the first rotary shaft 631 in Z axis direction. If the first sub reflective member 531 is rotated as much as the rotation angle counterclockwise, the other side of the first sub reflective member 531 may be arranged on the same plane as the first rotary shaft 631. In this case, the first sub reflective member 531 may be in contact with the second sub reflective member 532.

The second rotary shaft 632 is arranged in parallel with Y axis direction in a cylindrical shape, and may have one side rotatably coupled to the substrate P21 arranged in the second area 22 and the other side coupled to the second driver 634 arranged in the second area 22. The second rotary shaft 632 may be formed at a length longer than that of the first area 21 in the same manner as the first rotary shaft 631. Also, the second rotary shaft 632 may be spaced apart from the first rotary shaft 631 at the same length as that of the first area 21 in X axis direction or may be arranged to be spaced apart from the first rotary shaft 631 at a length longer than that of the first area 21. This is to exactly reflect the second sub image light L12 headed for the inside of the main body 3 toward the first area 21 by allowing the first sub reflective member 531 and the second sub reflective member 532 to be arranged on the same plane.

If the first rotary shaft 631 and the second rotary shaft 632 are spaced apart from each other at a length shorter than that of the first area 21, the first sub reflective member 531 and the second sub reflective member 532 are not arranged on the same plane in X axis direction, the second sub image light L12 headed for the inside of the main body 3 may be reflected toward another side without being reflected toward the first area 21, whereby luminance improvement of the first area 21 may be reduced.

One side of the second sub reflective member 532 may be coupled to the second rotary shaft 632. As the second rotary shaft 632 is rotated by the second driver 634, the second sub reflective member 532 may be rotated clockwise or counterclockwise. If the second sub reflective member 532 is rotated at 90° or more counterclockwise, the other side of the second sub reflective member 532 arranged in parallel with one side of the second sub reflective member 532 may be spaced apart from the second rotary shaft 632 in Z axis direction. If the second sub reflective member 532 is rotated as much as the rotation angle clockwise, the other side of the second sub reflective member 532 may be arranged on the same plane as the second rotary shaft 632. In this case, the other side of the second sub reflective member 532 may be in contact with the other side of the first sub reflective member 531.

The first driver 633 provides a driving force to rotate the first rotary shaft 631. The first driver 633 according to one example may be arranged in parallel with the first rotary shaft 631 in Y axis direction to provide a driving force to the first rotary shaft 631. In more detail, the first driver 633 may include a body portion and a head portion, wherein the body portion may be fixedly coupled to the second support member SP2, and the head portion may be coupled to the first rotary shaft 631. The head portion may be rotated by a driving force provided by the body portion to rotate the first rotary shaft 631 clockwise or counterclockwise. The first driver 633 may be a motor, but may be another device if it may provide a driving force.

The second driver 634 provides a driving force to rotate the second rotary shaft 632. The second driver 634 according to one example may be arranged in parallel with the second rotary shaft 632 in Y axis direction to provide a driving force to the second rotary shaft 632. The second driver 634 may be provided in the same structure as the first driver 633 to rotate the second rotary shaft 632 clockwise or counterclockwise. The second driver 634 may be a motor, but may be another device if it may provide a driving force.

Meanwhile, referring to FIG. 6B, the support member SP may include a first support member SP1 and a second support member SP2. The first support member SP1 may be coupled to the main body 3 as a part of the support member SP according to one example. The second support member SP2 is intended for balance of a height of the first rotary shaft 631 with a height of the first driver 633, and may be arranged between the first driver 633 and the first support member SP1. Also, the second support member SP2 is intended for balance of a height of the second rotary shaft 632 with a height of the second driver 634, and may be arranged between the second driver 634 and the first support member SP1. As shown in FIG. 6B, the second support member SP2 may be formed to be equal to or thicker than the thickness of the auxiliary member 4, whereby the first and second drivers 633 and 634 and the first and second rotary shafts 631 and 632 may be arranged in almost parallel with Y axis direction. Since the third moving member 63 according to the third aspect is not arranged below the third reflective member 53 but the first sub reflective member 531 and the second sub reflective member 532 are opened in Z axis direction, a predetermined space may be more required between the first and second rotary shafts 631 and 632 and the substrate P11 than the first aspect.

Also, although FIG. 6B shows that the first sub reflective member 531 and the second sub reflective member 532 are opened in an upward direction, the first sub reflective member 531 and the second sub reflective member 532 may be opened in a downward direction. However, in this case, the first sub reflective member 531 and the auxiliary member 4 may be spaced apart from each other at a distance that avoids collision therebetween. This case may equally be applied to the second sub reflective member 532 and the auxiliary member 4.

Meanwhile, in the display apparatus 1 according to the present disclosure, although the first area 21, the reflective member 5 and the auxiliary member 4 are arranged in one line in Z axis direction, the present disclosure is not limited thereto, the auxiliary member 4 may be arranged at another position in the space formed inside the main body 3. However, in this case, a plurality of reflective panels (or mirrors) or various shapes of reflective panels (or mirrors) may be arranged between the reflective member 5 and the auxiliary member 4 such that auxiliary member 4 may sense external light.

Figure 7:
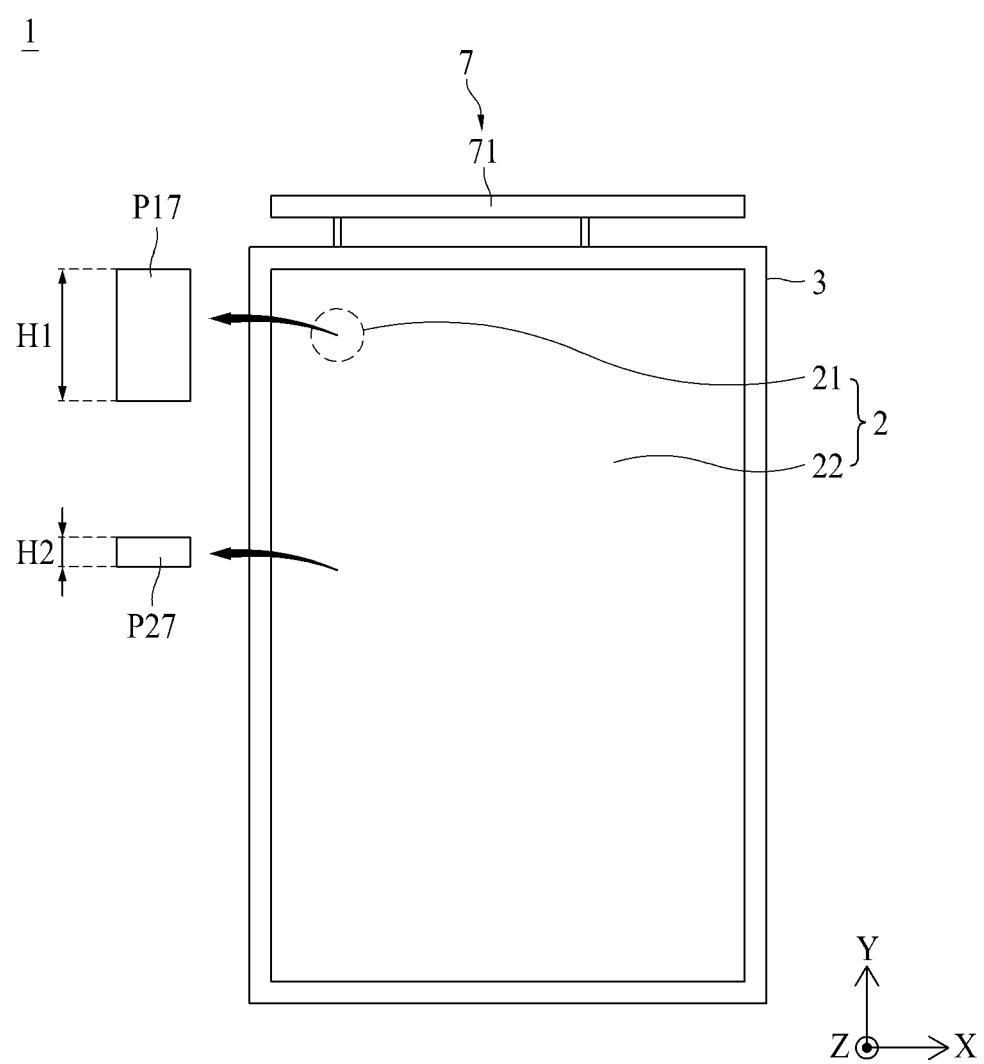
FIG. 7 is a brief plane view illustrating a first example of a drive IC of a display apparatus according to one aspect of the present disclosure.
Figure 8:
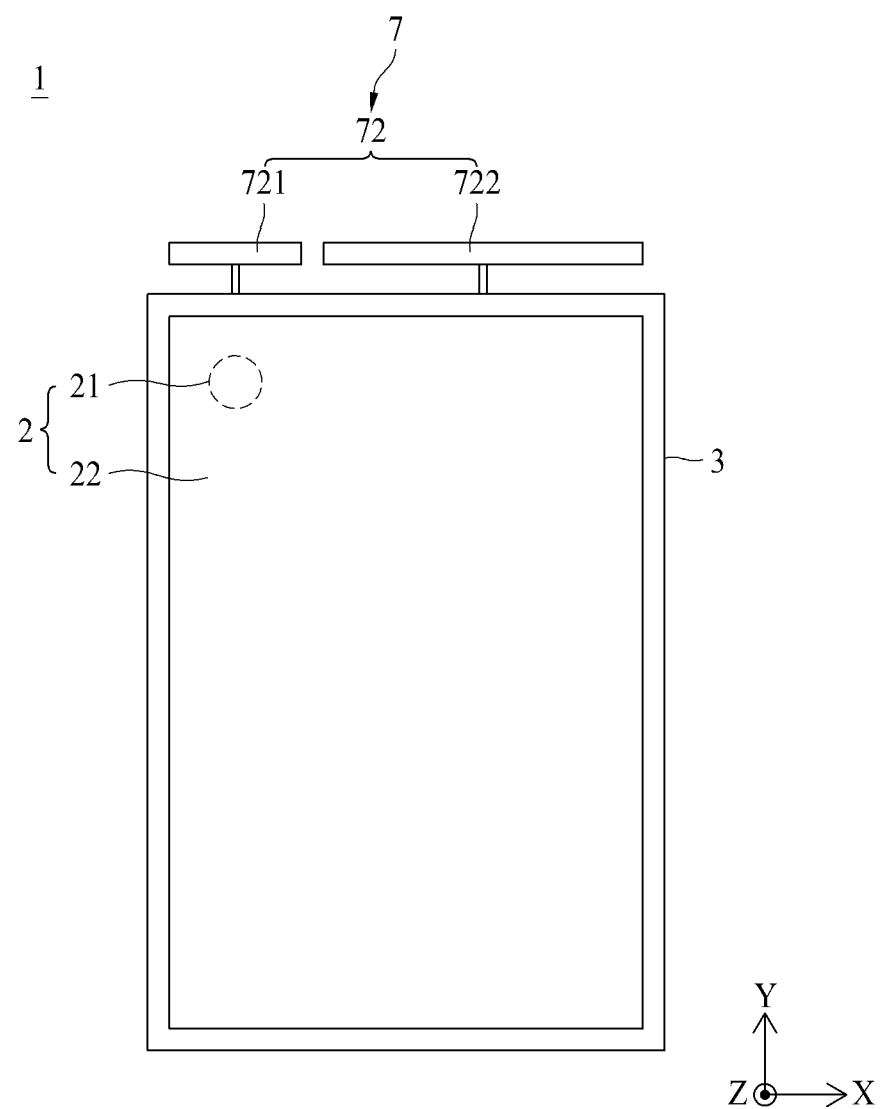
FIG. 8 is a brief plane view illustrating a second example of a drive IC of a display apparatus according to one aspect of the present disclosure.
Figure 9:
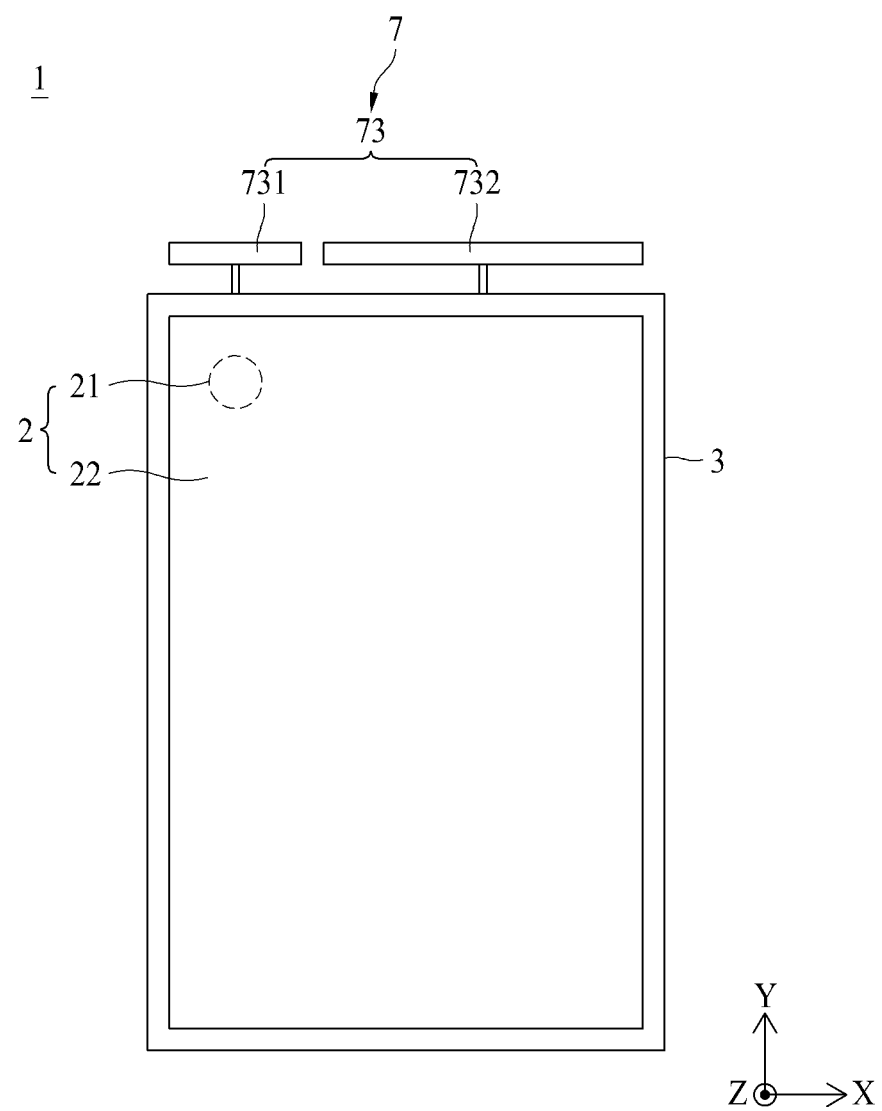
FIG. 9 is a brief plane view illustrating a third example of a drive IC of a display apparatus according to one aspect of the present disclosure.
Figure 10A:
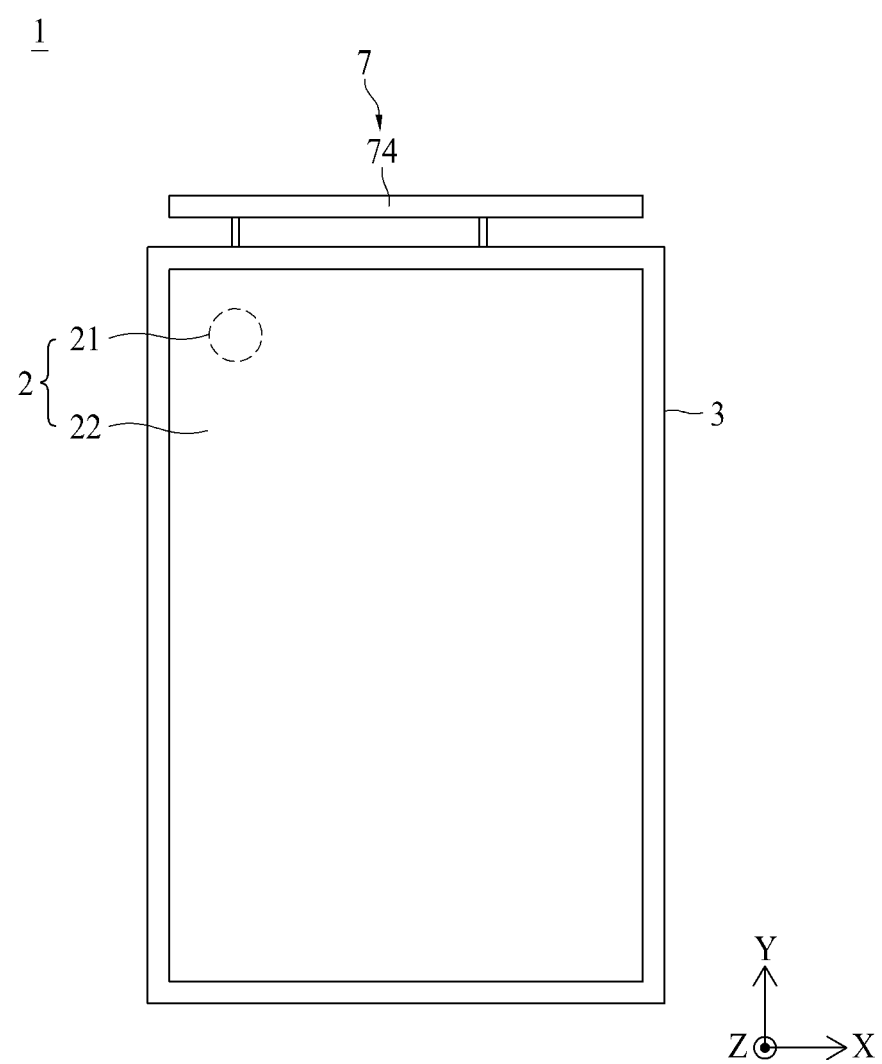
FIG. 10A is a brief plane view illustrating a fourth example of a drive IC of a display apparatus according to one aspect of the present disclosure.
Figure 10B:
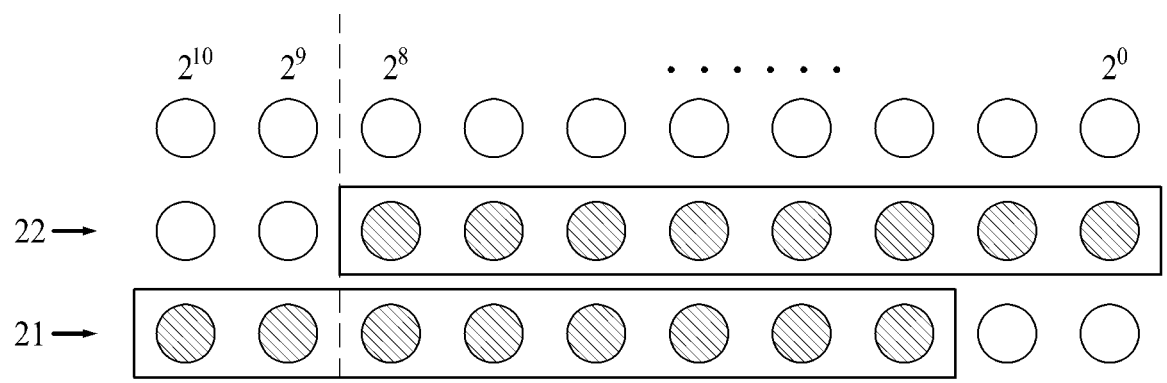
FIG. 10B is a brief view illustrating a driving method of a drive IC of FIG. 10A.

FIG. 7 is a brief plane view illustrating a first example of a drive IC of a display apparatus according to one aspect of the present disclosure, FIG. 8 is a brief plane view illustrating a second example of a drive IC of a display apparatus according to one aspect of the present disclosure, FIG. 9 is a brief plane view illustrating a third example of a drive IC of a display apparatus according to one aspect of the present disclosure, FIG. 10A is a brief plane view illustrating a fourth example of a drive IC of a display apparatus according to one aspect of the present disclosure, and FIG. 10B is a brief view illustrating a driving method of a drive IC of FIG. 10A.

Referring to FIGS. 7 to 10B, the display apparatus 1 according to one aspect of the present disclosure may further comprise a drive IC 7.

The drive IC 7 is intended to apply a driving voltage to a plurality of thin film transistors. The drive IC 7 may be connected to the display panel 2 to apply a driving voltage to a plurality of thin film transistors. The drive IC 7 may be stored in the main body 3. As described above, even though the reflective member 5 emits the second image light L12 emitted toward the inside of the main body 3 to the first area 21, a luminance difference of about 30 may occur between the second image light L2 emitted from the second area 22 and the first image light L1 emitted from the first area 21. The display apparatus 1 according to one aspect of the present disclosure is intended to allow a user to have no sense of difference for images by reducing a luminance difference between the first image light L1 emitted from the first area 21 and the second image light L2 emitted from the second area 22. Therefore, the display apparatus 1 may be provided to reduce a luminance difference between the first image light L1 emitted from the first area 21 and the second image light L2 emitted from the second area in accordance with types and the number of drive ICs 7 and a size of a thin film transistor.

That is, in the display apparatus 1 according to one aspect of the present disclosure, the aspects in which a luminance difference between the first image light L1 and the second image light L2 is compensated may be categorized using types and the number of drive ICs 7 or the size of the thin film transistor. The drive ICs 7 may include a first drive IC 71 according to the first aspect for luminance compensation, a second drive IC 72 according to the second aspect for luminance compensation, a third drive IC 73 according to the third aspect for luminance compensation, and a fourth drive IC 74 according to the fourth aspect for luminance compensation.

First of all, referring to FIG. 7, in the first aspect for luminance compensation, the size of the thin film transistor arranged in the first area 21 and the second area 22 may be varied to compensate for luminance of the first area 21.

In more detail, in the first aspect for luminance compensation, the first transistor P17 arranged in the first area 21 and the second thin film transistor P27 arranged in the second area 22 may electrically be connected to one first drive IC 71, and the size of the first thin film transistor P17 may be provided to be greater than that of the second thin film transistor, whereby a luminance difference between the first image light L1 and the second image light L2 may be compensated.

For example, a first length H1 which is Y axis direction length of the first thin film transistor P17 may be provided to be longer than a second length H2 which is Y axis direction length of the second thin film transistor P27, whereby the size of the first thin film transistor P17 may be provided to be greater than that of the second thin film transistor P27. Since the size of the thin film transistor is proportional to a current, even though the first drive IC 71 supplies the same voltage to the first thin film transistor P17 and the second thin film transistor P27, more current flows to the first thin film transistor P17 greater than the second thin film transistor P27, whereby first luminance emitted from the organic light emitting layer P14 arranged in the first area 21 may be provided to be higher than second luminance emitted from the organic light emitting layer P24 arranged in the second area 22.

For example, if a first driving current flowing in the first thin film transistor P17 is 140, a second driving current flowing in the second thin film transistor P27 may be 100. In this case, if luminance of the second image light L2 emitted from the second area 22 is 100, the first image light L1 emitted from the first area 21 may have luminance of about 97 by a sum of 48.5 which is luminance of the first sub image light L11 directly emitted from the organic light emitting layer P14 to the outside and 48.5 which is luminance of the second sub image light L12 reflected in the reflective member 5 and emitted to the first area 21. As a result, in the display apparatus 1 according to one aspect of the present disclosure, according to a luminance compensation structure of the first aspect, since there is almost no luminance difference between the first image light L1 and the second image light L2, a user has no sense of difference for images emitted from the first area 21 and the second area 22, whereby satisfaction for the images may be enhanced.

Meanwhile, the first drive IC 71 provided in the first aspect for luminance compensation may be 8-bit single drive IC that may express 256 gray scale.

Next, referring to FIG. 8, in the second aspect for luminance compensation, a plurality of drive ICs are provided to vary a driving voltage applied to each of the first area 21 and the second area 22, whereby a luminance difference between the first area 21 and the second area 22 is reduced.

In more detail, in the second aspect for luminance compensation, a first sub drive IC 721 for applying a first driving voltage to emit light in the first area 21, and a second sub drive IC 722 for applying a second driving voltage to emit light in the second area 22 may be included. The first sub drive IC 721 and the second sub drive IC 722 may be included in the second drive IC 72.

The first sub drive IC 721 may electrically be connected with the first area 21 to apply a first driving voltage, thereby emitting light in the first area 21.

The second sub drive IC 722 may electrically be connected with the second area 22 to apply a second driving voltage, thereby emitting light in the second area 22.

In this case, the second driving voltage may be smaller than the first driving voltage. Therefore, the first luminance emitted from the organic light emitting layer P14 arranged in the first area 21 may be provided to be higher than the second luminance emitted from the organic light emitting layer P24 arranged in the second area 22.

Since the display apparatus 1 according to one aspect of the present disclosure is intended to allow a user to have no sense of difference for images by reducing a luminance difference between the first image light L1 emitted from the first area 21 and the second image light L2 emitted from the second area 22, the second aspect for luminance compensation is intended to reduce a luminance difference between the first area 21 and the second area 22 by reducing luminance of the second area 22.

For example, if the second sub drive IC 722 applies a driving voltage to flow a second driving current of about 69.4 in the second area 22 and the first sub drive IC 721 applies a driving voltage to flow a first driving current of about 100 in the first area 21, luminance of the second image light L2 emitted from the second area 22 may be about 69.4, and the first image light L1 emitted from the first area 21 may have luminance of about 69.4 by a sum of 34.7 which is luminance of the first sub image light L11 directly emitted from the first area 21 to the outside and 34.7 which is luminance of the second sub image light L12 reflected in the reflective member 5 and emitted from the first area 21.

As a result, in the display apparatus 1 according to one aspect of the present disclosure, according to a luminance compensation structure of the second aspect, since there is almost no luminance difference between the first image light L1 and the second image light L2, a user has no sense of difference for images emitted from the first area 21 and the second area 22, whereby satisfaction for the images may be enhanced. However, in the luminance compensation structure according to the second aspect, luminance of the second area 22 and the first area 21 is about 69.4, whereby whole luminance may be provided to be lower than 100.

Meanwhile, the first and second sub drive ICs 721 and 722 provided in the second aspect for luminance compensation may be 8-bit single drive IC that may express 256 gray scale. That is, the first and second sub drive ICs 721 and 722 provided in the second aspect for luminance compensation may be the same drive IC.

Next, referring to FIG. 9, in the third aspect for luminance compensation, a plurality of drive ICs are provided to vary a driving voltage applied to each of the first area 21 and the second area 22, whereby a luminance difference between the first area 21 and the second area 22 is reduced. Therefore, the third aspect for luminance compensation is similar to the second aspect for luminance compensation in that a luminance difference between the first area 21 and the second area 22 is reduced using a plurality of drive ICs. However, the first sub drive IC 731 used in the third aspect for luminance compensation may be a high-output drive IC that applies a higher voltage than that of the second sub drive IC 732. That is, the third aspect for luminance compensation is different from the second aspect for luminance compensation in that the first sub drive IC 731 and the second sub drive IC 732 having their respective maximum outputs different from each other are used.

In more detail, in the third aspect for luminance compensation, a first sub drive IC 731 for applying a first driving voltage to emit light in the first area 21, and a second sub drive IC 732 for applying a second driving voltage to emit light in the second area 22 may be included. The first sub drive IC 731 and the second sub drive IC 732 may be included in the third drive IC 73.

The first sub drive IC 731 may electrically be connected with the first area 21 to apply a first driving voltage, thereby emitting light in the first area 21.

The second sub drive IC 732 may electrically be connected with the second area 22 to apply a second driving voltage, thereby emitting light in the second area 22.

In this case, the second driving voltage may be smaller than the first driving voltage. Therefore, the first luminance emitted from the organic light emitting layer P14 arranged in the first area 21 may be provided to be higher than the second luminance emitted from the organic light emitting layer P24 arranged in the second area 22.

The third aspect for luminance compensation is different from the second aspect for luminance compensation in that the first driving voltage and the second driving voltage applied from the first sub drive IC 731 and the second sub drive IC 732 of the third aspect are greater than the first driving voltage and the second driving voltage applied from the first sub drive IC 721 and the second sub drive IC 722 of the second aspect. That is, luminance of the second area 22 is lowered to reduce a luminance difference with the first area 21 in the second aspect for luminance compensation, whereas luminance of the first area 21 is enhanced to reduce a luminance difference with the second area 22 in the third aspect for luminance compensation.

For example, the first sub drive IC 721 of the second aspect may apply a driving voltage to the first thin film transistor P17 to generate a driving current of 100 and the sub drive IC 722 may apply a driving voltage to the second thin film transistor P27 to generate a driving current of 69.4, whereas the first sub drive IC 731 of the third aspect may apply a driving voltage to the first thin film transistor P17 to generate a driving current of 140 and the sub drive IC 732 may apply a driving voltage to the second thin film transistor P27 to generate a driving current of 100. That is, the second drive IC 72 of the second aspect may be provided to generate a driving current of 100 or less, whereas the third drive IC 73 of the third aspect may be provided to generate a driving current of 100 or more.

Therefore, according to luminance compensation of the third aspect, luminance of the second image light L2 emitted from the second area 22 may be about 100, and luminance of the first image light L1 emitted from the first area 21 may be about 97 by a sum of 48.5 which is luminance of the first sub image light L11 directly emitted from the first area 21 to the outside and 48.5 which is luminance of the second sub image light L12 reflected in the reflective member 5 and emitted from the first area 21.

Consequently, in the display apparatus 1 according to one aspect of the present disclosure, according to a luminance compensation structure of the third aspect, since there is almost no luminance difference between the first image light L1 and the second image light L2, a user has no sense of difference for the images emitted from the first area 21 and the second area 22, whereby satisfaction for the images may be enhanced. However, in the luminance compensation structure according to the third aspect, higher luminance than the luminance according to the second aspect may be implemented, whereby a user's satisfaction for the images may be more enhanced.

Next, referring to FIGS. 10A and 10B, in the fourth aspect for luminance compensation, one drive IC is used to vary a driving voltage applied to each of the first area 21 and the second area 22, whereby a luminance difference between the first area 21 and the second area 22 is reduced. Therefore, the fourth aspect for luminance compensation is similar to the first aspect for luminance compensation in that a luminance difference between the first area 21 and the second area 22 is reduced using one drive IC. However, the fourth drive IC 74 used in the fourth aspect for luminance compensation is different from the first drive IC 71 used in the first aspect in that a drive IC for applying a higher voltage than that of the first drive IC 71 is used. In the first aspect for luminance compensation, the first thin film transistor P17 and the second thin film transistor P27 are provided to have their respective sizes different from each other. However, in the fourth aspect for luminance compensation, the thin film transistors of the same size are provided in the first area 21 and the second area 22.

In more detail, in the fourth aspect for luminance compensation, a fourth drive IC 74 capable of applying a high voltage may be used to apply a second driving voltage to the second area 22, and may apply a first driving voltage higher than the second driving voltage to the first area 21. For example, the fourth drive IC 74 may be 10 bit single drive IC.

The fourth drive IC 74 may electrically be connected with the first area 21 and the second area 22 to respectively apply the first driving voltage and the second driving voltage, which are different from each other, to the first area 21 and the second area 22.

For example, as shown in FIG. 10B, the fourth drive IC 74 may apply a second driving voltage of low 8 bits to the second area 22 to flow a second driving current of 100 to the second thin film transistor P27, and may apply a first driving voltage of high 8 bits to the first area 21 to flow a first driving current of 140 to the first thin film transistor P17. That is to say, the second driving voltage applied to the second area is the low 8 bits of the driving voltage of 10 bits supplied from the fourth drive IC, while the first driving voltage applied to the first area is the high 8 bits of the driving voltage of 10 bits supplied from the fourth drive IC.

Therefore, according to luminance compensation of the fourth aspect, luminance of the second image light L2 emitted from the second area 22 may be about 100, and luminance of the first image light L1 emitted from the first area 21 may be about 97 by a sum of 48.5 which is luminance of the first sub image light L11 directly emitted from the first area 21 to the outside and 48.5 which is luminance of the second sub image light L12 reflected in the reflective member 5 and emitted from the first area 21.

Consequently, in the display apparatus 1 according to one aspect of the present disclosure, according to a luminance compensation structure of the fourth aspect, since there is almost no luminance difference between the first image light L1 and the second image light L2, a user has no sense of difference for the images emitted from the first area 21 and the second area 22, whereby satisfaction for the images may be enhanced. Also, in the luminance compensation structure according to the fourth aspect, since one fourth drive IC 74 is used, a manufacturing process may be more simplified than the second aspect and the third aspect in which the plurality of drive ICs are used. Also, the manufacturing process may be more simplified than the first aspect in which thin film transistors of different sizes are used.

Meanwhile, the display apparatus 1 according to one aspect of the present disclosure may be provided to output image light from the display panel 2 even in the case that the auxiliary member 4 is driven in accordance with a user's setup. In this case, the reflective member 5 may be arranged in the second area 22 by the moving member 6, and a luminance difference between the first area 21 and the second area 22 may be minimized using the first to fourth aspects for luminance compensation.

However, in this case, since the light entering the auxiliary member 4 may include the external light and the second sub image light L12 emitted from the first area 21, the second sub image light L12 entering the auxiliary member 4 may be removed through a separate correction algorithm, whereby exactness of the external light sensed by the auxiliary member 4 may be improved.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various aspects described above can be combined to provide further aspects. Aspects of the aspects can be modified, if necessary to employ concepts of the various patents, applications and publications to provide yet further aspects.

These and other changes can be made to the aspects in light of the above-detailed description. In general, in the following claims, the terms used should not be construed to limit the claims to the specific aspects disclosed in the specification and the claims, but should be construed to include all possible aspects along with the full scope of equivalents to which such claims are entitled. Accordingly, the claims are not limited by the disclosure.

What is claimed is:

1. A display apparatus comprising:
a display panel having a first area and a second area;
a main body supporting the display panel;
an auxiliary member arranged in the main body; and;
a reflective member arranged between the auxiliary member and the display panel,
wherein the reflective member is movably provided so as to alternately overlap with the first area or the second area, and
wherein the first area is configured to have double-sided emission, and the second area is configured to have single-sided emission.

2. The display apparatus of claim 1, wherein the auxiliary member is disposed under the first area of the display panel.

3. The display apparatus of claim 1, wherein the reflective member moves to overlap with the second area when the auxiliary member is driven, and the reflective member moves to overlap with the first area when the auxiliary member is not driven.

4. The display apparatus of claim 1, wherein the auxiliary member is at least one of a camera, a proximity sensor, an illumination sensor and a speaker.

5. The display apparatus of claim 1, wherein the reflective member has a size equal to or greater than that of the first area.

6. The display apparatus of claim 1, wherein the first area includes a first pixel and the second area includes a second pixel, and
wherein the first pixel and the second pixel have a same size.

7. The display apparatus of claim 6, wherein each of the first pixel and the second pixel includes:
a substrate having a first subpixel, a second subpixel and a third subpixel;
a first electrode provided on the substrate;
a bank provided to cover edges of the first electrode;
an organic light emitting layer arranged on the first electrode;
a second electrode arranged on the organic light emitting layer and the bank; and
an encapsulation layer arranged on the second electrode.

8. The display apparatus of claim 7, wherein the bank in the first pixel is transparent, and the bank in the second pixel is opaque.

9. The display apparatus of claim 7, wherein the first electrode of the second pixel is a reflective electrode, and the first electrode of the first pixel is a transparent electrode.

10. The display apparatus of claim 7, wherein the organic light emitting layer includes:
a first organic light emitting layer arranged in the first subpixel;
a second organic light emitting layer arranged in the second subpixel; and
a third organic light emitting layer arranged in the third subpixel, wherein the first organic light emitting layer emits red light, the second organic light emitting layer emits green light, and the third organic light emitting layer emits blue light.

11. The display apparatus of claim 1, further comprising a moving member for moving the reflective member to overlap with the first area or the second area.

12. The display apparatus of claim 11, wherein the moving member includes:
a rotary shaft coupled to the reflective member; and
a driver providing a driving force to rotate the rotary shaft.

13. The display apparatus of claim 11, wherein the reflective member includes a plurality of sub reflective members, the moving member includes a plurality of pistons coupled to the sub reflective members respectively, and the plurality of pistons are spaced apart from one another and arranged in the second area to surround the first area.

14. The display apparatus of claim 11, wherein the reflective member includes a first sub reflective member and a second sub reflective member, and
wherein the moving member includes:
a first rotary shaft coupled to one side of the first sub reflective member;
a second rotary shaft coupled to one side of the second sub reflective member;
a first driver providing a driving force to rotate the first rotary shaft; and
a second driver providing a driving force to rotate the second rotary shaft.

15. The display apparatus of claim 1, further comprising:
a first thin film transistor arranged in the first area;
a second thin film transistor arranged in the second area; and
a drive IC for applying a driving voltage to the first thin film transistor and the second thin film transistor,
wherein the first thin film transistor has a size greater than that of the second thin film transistor.

16. The display apparatus of claim 1, further comprising;
a first sub drive IC applying a first driving voltage to emit light in the first area; and
a second sub drive IC applying a second driving voltage to emit light in the second area,
wherein the first sub drive IC and the second sub drive IC are a same drive ICs, and the second driving voltage is smaller than the first driving voltage.

17. The display apparatus of claim 1, further comprising;
a first sub drive IC applying a first driving voltage to emit light in the first area; and
a second sub drive IC applying a second driving voltage to emit light in the second area,
wherein the first sub drive IC is a high-output drive IC applying a voltage higher than that of the second sub drive IC.

18. The display apparatus of claim 1, further comprising a drive IC applying a driving voltage to emit light in the first area and the second area,
wherein the drive IC applies a second driving voltage to the second area and applies a first driving voltage higher than the second driving voltage to the first area.

19. The display apparatus of claim 18, wherein the second driving voltage applied to the second area is lower 8 bits of the driving voltage of 10 bits applied from the drive IC, and
wherein the first driving voltage applied to the first area is higher 8 bits of the driving voltage of 10 bits applied from the drive IC.

* * * * *